(12) United States Patent
Sanmiya et al.

(10) Patent No.: US 7,463,173 B2
(45) Date of Patent: Dec. 9, 2008

(54) CHARGED PARTICLE BEAM APPARATUS, ABNORMALITY DETECTING METHOD FOR DA CONVERTER UNIT, CHARGED PARTICLE BEAM WRITING METHOD, AND MASK

(75) Inventors: Yoshimasa Sanmiya, Shizuoka (JP); Akira Noma, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 11/692,409

(22) Filed: Mar. 28, 2007

(65) Prior Publication Data
US 2007/0229337 A1  Oct. 4, 2007

(30) Foreign Application Priority Data
Mar. 31, 2006  (JP) .............................. 2006-097370

(51) Int. Cl.
*H03M 1/10* (2006.01)
(52) U.S. Cl. ..................................... 341/120; 341/144
(58) Field of Classification Search ......... 341/118–120, 341/144, 145, 154, 110; 250/492.23, 492.22
See application file for complete search history.

(56) References Cited

U.S. PATENT DOCUMENTS

| | | | |
|---|---|---|---|
| 5,051,556 A * | 9/1991 | Sakamoto et al. ...... | 219/121.25 |
| 5,134,300 A * | 7/1992 | Kai et al. ................. | 250/492.2 |
| 5,614,725 A * | 3/1997 | Oae et al. ............. | 250/492.22 |
| 7,209,055 B1 * | 4/2007 | Stovall et al. .................. | 341/14 |

FOREIGN PATENT DOCUMENTS

| JP | 2004-259812 | 9/2004 |
|---|---|---|
| JP | 2005-129614 | 5/2005 |

* cited by examiner

*Primary Examiner*—Brian Young
(74) *Attorney, Agent, or Firm*—Oblon, Spivak, McClelland, Maier & Neustadt, P.C.

(57) ABSTRACT

A charged particle beam apparatus includes a plurality of digital-analog (DA) converter units configured to input digital signals, convert the digital signals into analog values, and amplify the analog values to output the analog values, a deflector configured to input at least one analog value of the plurality of analog values output from the plurality of DA converter units to deflect a charged particle beam, and a judging unit configured to judge that at least one of the plurality of DA converter units is abnormal by using the plurality of analog values output from the plurality of DA converter units.

7 Claims, 11 Drawing Sheets

Related Art

CHARGED PARTICLE BEAM APPARATUS, ABNORMALITY DETECTING METHOD FOR DA CONVERTER UNIT, CHARGED PARTICLE BEAM WRITING METHOD, AND MASK

CROSS-REFERENCE TO RELATED APPLICATION

This application is based upon and claims the benefit of priority from prior Japanese Patent Application No. 2006-097370 filed on Mar. 31, 2006 in Japan, the entire contents of which are incorporated herein by reference.

BACKGROUND OF THE INVENTION

1. Field of the Invention

The present invention relates to a charged particle beam apparatus, an abnormality detecting method for a digital-analog (DA) converter unit, a charged particle beam writing method, and a mask. For example, the present invention related to an electron beam writing method and apparatus which deflect a variably shaped electron beam to irradiate the electron beam on a target object. Furthermore, the present invention relates to an abnormality detecting method for a digital-analog converter (DAC) amplification unit (to be simply referred to as DAC amplifier) to deflect an electron beam.

2. Related Art

A lithography technique which leads development of micro-patterning of a semiconductor device is a very important and only one process which generates a pattern in semiconductor manufacturing processes. In recent years, with high integration of an LSI, a circuit line width required for semiconductor devices progressively decreases year by year. In order to form a desired circuit pattern on the semiconductor devices, a high-precision master pattern plate (also called a reticle or a mask) is necessary. An electron beam writing technique has an excellent resolution and is used in production of a high-precision master pattern plate or a mask.

FIG. 11 is a conceptual diagram for explaining an operation of a variable-shaped electron beam photolithography apparatus. A variable-shaped electron beam photolithography apparatus (EB (Electron Beam) writing apparatus) operates as follows. In a first aperture plate 410, rectangular opening 411, a square, for example, is formed to shape an electron beam 330. In a second aperture plate 420, a variable-shaping opening 421 is formed to shape the electron beam 330 having passed through the opening 411 to a desired variable rectangular shape. The electron beam 330 irradiated from a charged particle source 430 and having passed through the opening 411 of the first aperture plate 410 is deflected by a deflector. The electron beam 330 passes through a part of the variable-shaping opening 421 and is irradiated on a target object 340 placed on a stage. The electron beam 303 having passed through the variable-shaping opening 421 is deflected by a deflector and irradiates at a predetermined position of the target object 340. Irradiations of the electron beams shaped by the opening 411 and the variable-shaping opening 421 on the predetermined position on the target object 340 are combined to each other to make it possible to write an arbitrary pattern at a high-speed. Since a range in positioning beams by deflection is limited, the target object is placed on an X-Y stage, and writing of a predetermined pattern in a large area can be performed by moving the stage. A scheme which continuously moves the stage in a predetermined direction (for example, an X direction) during writing to improve the writing time may be employed. A scheme which causes an electron beam to pass through both the opening 411 and the variable-shaping opening 421 to form an electron beam having a variable shape is called a variable shaping scheme.

As described above, in a writing apparatus, a charged particle beam such as an electron beam is deflected to write a pattern. In this beam deflection, a DAC amplifier unit (to be simply referred to a DAC amplifier) is used. As roles of the beam deflection using the DAC amplifier unit, for example, control of the shape and size of a beam shot, control of the position of a beam shot, and blanking of a beam are known.

In this case, when an error occurs in the DAC amplifier unit, an amount of beam deflection is different from a desired deflection amount. For this reason, abnormal or defective writing consequently occurs. However, abnormal writing caused by an error in the DAC amplifier unit is often detected by an inspection of a written pattern. This is because abnormality of the DAC amplifier unit cannot be detected during writing. For this reason, writing is continuously done with the abnormal DAC amplifier unit, the writing continues in an abnormal writing state. As a result, the defective masks are continuously written to make heavy losses in mask manufacturing.

A technique which measures settling times of the DAC amplifier units at high accuracy by measuring a change in voltage at a middle point of a measuring resistor connected between outputs of two DAC amplifier units, while a deflection data is input to one of the DAC amplifiers, and the opposite deflection data is input to the other DAC amplifier with a delay time, is disclosed in a reference (for example, see Published Unexamined Japanese Patent Application No. 2004-259812 (JP-A-2004-259812)), though this is not related to the detection of abnormality of the DAC amplifiers.

As described above, since abnormal or defective writing occurs when an error occurs in the DAC amplifier unit, a method of detecting abnormality of the DAC amplifier unit is demanded. Furthermore, the abnormality of the DAC amplifier unit includes the following cases. That is, the DAC amplifier unit may be completely broken, and the DAC amplifier may be abnormal only under a specific condition. Furthermore, when abnormality occurs under a specific condition, the abnormality may be repeatable or may not be repeatable. In particular, when repeatability is not maintained, the abnormality of the DAC amplifier unit cannot be easily identified, and a long time is required until the problem is resolved. And, when the level of abnormality of the DAC amplifier unit is small, an amount of abnormality of a written pattern is also small. For this reason, the abnormality may not be detected in pattern inspection after writing. In this case, abnormal or defective masks, abnormal or defective wafers, and the like are continuously written (manufactured), and secondary damage in manufacturing may occur. Therefore, a technique and device for detecting an abnormal/erroneous operation of a DAC amplifier unit at high accuracy on real time during writing a pattern is very useful. Abnormality detection for a DAC amplifier unit (or simply called DAC amplifier) serving as an example of a DA converter is necessary for not only a writing apparatus but also all apparatuses having a function that deflects a charged particle beam by using a DA converter unit.

BRIEF SUMMARY OF THE INVENTION

It is an object of the present invention to provide a method or apparatus capable of detecting abnormality of a DA converter unit.

In accordance with one aspect of the present invention, a charged particle beam apparatus includes a plurality of digital-analog (DA) converter units configured to input digital signals, convert the digital signals into analog values, and amplify the analog values to output the analog values, a deflector configured to input at least one analog value of the plurality of analog values output from the plurality of DA converter units to deflect a charged particle beam, and a judging unit configured to judge that at least one of the plurality of DA converter units is abnormal by using the plurality of analog values output from the plurality of DA converter units.

In accordance with another aspect of the present invention, an abnormality detecting method of detecting abnormality of a digital-analog (DA) converter units which outputs an analog value to a deflector which deflects a charged particle beam, includes by using first and second DA converter units, causing the second DA converter unit to synchronously output a plus-minus reversed output value the polarity of which is opposite to an output value from the first DA converter unit, and detecting abnormality of at least one of the first and second DA converter units when a sum of the output value from the first DA converter unit and the plus-minus reversed output value from the second DA converter unit exceeds a threshold value to output a result of the detecting.

In accordance with another aspect of the present invention, a charged particle beam writing method of writing a pattern on a target object by using a charged particle beam, includes during writing, causing a second DA converter unit to synchronously output a plus-minus reversed output value which is opposite to an output value from a first digital-analog (DA) converter unit for use in beam deflection, and judging that at least one of the first and second DA converter units is abnormal when a sum of the output value from the first DA converter unit and the plus-minus reversed output value from the second DA converter unit exceeds a predetermined threshold value to output a result of the detecting.

In accordance with another aspect of the present invention, a mask includes a glass substrate, and a predetermined film which is formed on the glass substrate and has a pattern written by using a writing apparatus in which, when, during writing, a sum of an output value from a first digital-analog (DA) converter unit for use in beam deflection and a plus-minus reversed output value output from a second DA converter unit which is output in synchronism with the output value from the first DA converter unit exceeds a predetermined threshold value, it is judged that at least one of the first and second DA converter units is abnormal.

DETAILED DESCRIPTION OF THE INVENTION

In embodiments, configurations using an electron beam, as an example of a charged particle beam, will be described below. The charged particle beam is not limited to an electron beam, and a beam such as an ion beam using charged particles may be used. As an example of a charged particle beam apparatus, a writing apparatus will be described below. The charged particle beam apparatus is not limited to the writing apparatus, and an electron microscope, an inspection apparatus, or the like may be used. Any apparatus which uses a deflected charged particle beam may be included.

First Embodiment

Figure 1:
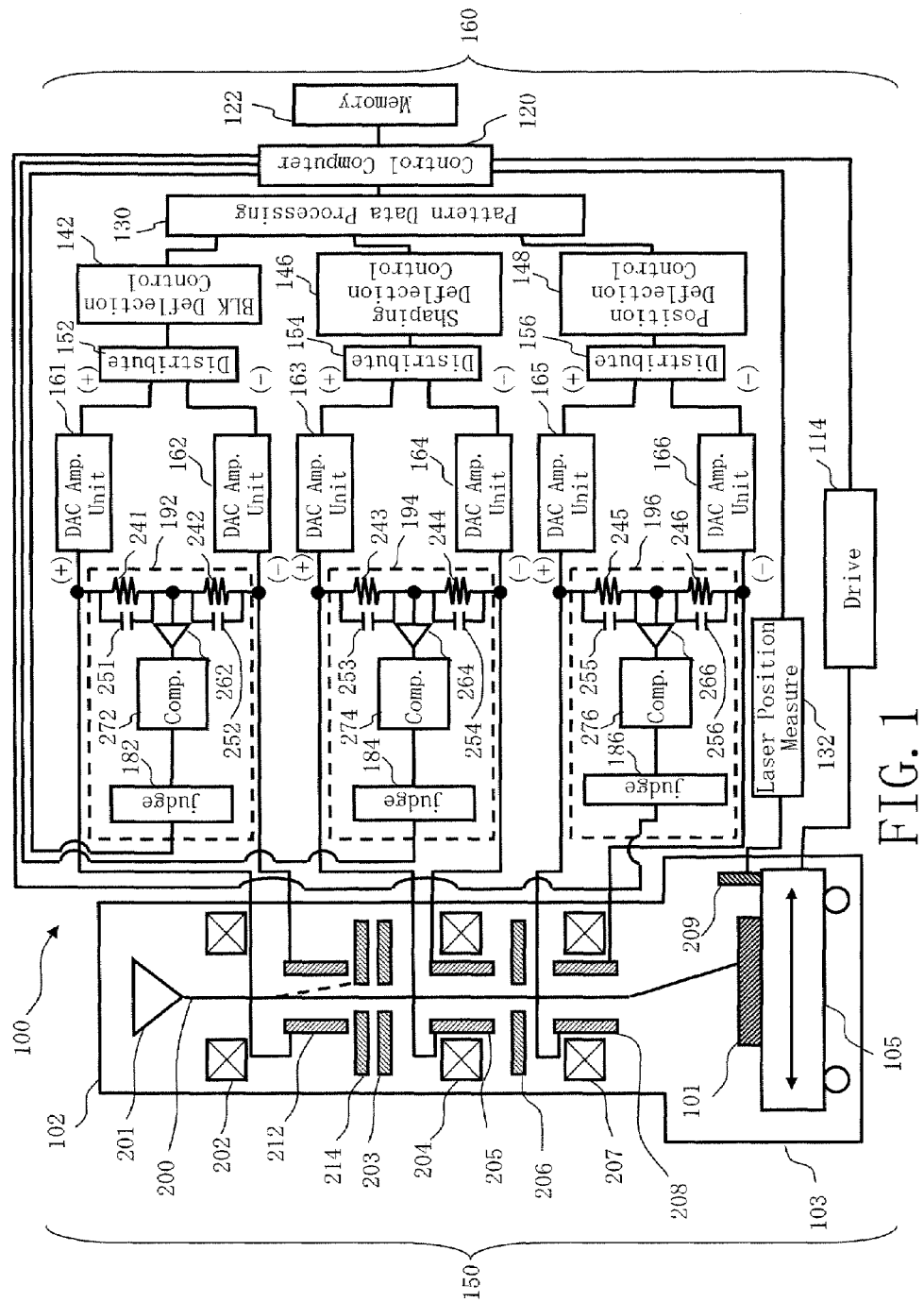
FIG. 1 is a conceptual diagram showing a configuration of a writing apparatus according to a first embodiment.

FIG. 1 is a conceptual diagram showing a configuration of a writing apparatus according to a first embodiment.

In FIG. 1, a writing apparatus 100 is an example of a charged particle beam writing apparatus. The writing apparatus 100 is a variable-shaped beam writing apparatus. The writing apparatus 100 writes a predetermined pattern on a target object 101. The target object 101 includes a mask blank. The writing apparatus writes a pattern on the mask blank. The mask blank is processed to a mask for use in a lithography step in a semiconductor manufacturing process. The writing unit 100 includes a writing unit 150 and a control unit 160. The writing unit 150 has an electron column 102 and a writing chamber 103. Arranged in the electron column 102 are an electron gun assembly 201, an illumination lens 202, a blanking (BLK) deflector 212, a BLK aperture plate 214, a first shaping aperture plate 203, an projection lens 204, a shaping deflector 205, a second shaping aperture plate 206, an objective lens 207, and an objective deflector 208. An X-Y stage 105 is arranged in the writing chamber 103. A mirror 209 is arranged on the X-Y stage 105. The target object 101 is placed on the X-Y stage 105. The control unit 160 includes a control computer 120, a memory 122, a pattern data processing circuit 130, a BLK deflection control circuit 142, a distributing circuit 152, a digital-analog converter (DAC) amplifier unit 161, a DAC amplifier unit 162, an abnormality detecting mechanism 192, a shaping deflection control circuit 144, a distributing circuit 154, a DAC amplifier unit 163, a DAC amplifier unit 164, an abnormality detecting mechanism 194, a position deflection control circuit 146, a distributing circuit 156, a DAC amplifier unit 165, a DAC amplifier unit 166, an abnormality detecting mechanism 196, a laser position measuring system 132, and a drive circuit 114. The abnormality detecting mechanism 192 includes a comparing circuit 272, a judging circuit 182, a resistor 241, a resistor 242, a capacitor 251, a capacitor 252, and an amplifier 262. The abnormality detecting mechanism 194 includes a comparing circuit 274, a judging circuit 184, a resistor 243, a resistor 244, a capacitor 253, a capacitor 254, and an amplifier 264. The abnormality detecting circuit 196 includes a comparing circuit 276, a judging circuit 186, a resistor 245, a resistor 246, a capacitor 255, a capacitor 256, and an amplifier 266.

Connected to the control computer 120 are the memory 122, the pattern data processing circuit 130, the judging circuit 182, the judging circuit 184, the judging circuit 186, the laser position measuring system 132, and the stage-drive circuit 114 through a bus (not shown). The pattern data processing circuit 130 and the drive circuit 114 are controlled by control signals output from the control computer 120. judged results from the judging circuit 182, the judging circuit 184 and the judging circuit 186, and the position information from the laser position measuring system 132 which measures a position of the X-Y stage 105 with a laser and the mirror 209, are transmitted to the control computer 120. Input data, output data, or the like calculated by the control computer 120 are stored in the memory 122.

The BLK deflection control circuit 142, the shaping deflection control circuit 144, and the position deflection control circuit 146 are connected through a bus (not shown) to the pattern data processing circuit 130 which processes pattern data to perform shot division or the like. The BLK deflection control circuit 142, the shaping deflection control circuit 144, and the position deflection control circuit 146 are controlled by data from the pattern data processing circuit 130 to perform beam deflection according to the shot data processed by the pattern data processing circuit 130.

The distributing circuit 152 is connected to the BLK deflection control circuit 142 through a bus (not shown). The distributing circuit 152 converts control signals from the BLK deflection control circuit 142 into a (+) signal and a (−) signal. One of the signals and the other are distributed to the DAC amplifier unit 161 and the DAC amplifier unit 162, respectively, in synchronism with each other. FIG. 1 shows an example in which the (+) signal is distributed to the DAC amplifier unit 161 while the (−) signal is distributed to the DAC amplifier unit 162. The output side of the DAC amplifier unit 161 is connected to one electrode of a pair of electrodes of the BLK deflector 212. The (+) signal is digital-analog converted (DA converted) into an analog value in the DAC amplifier unit 161 and then amplified. The amplified analog value is applied to one of the pair of electrodes of the BLK deflector 212 as a beam deflecting voltage. On the other hand, the output side of the DAC amplifier unit 162 is connected to the other of the pair of electrodes of the BLK deflector 212. The (−) signal is digital-analog converted (DA converted) into an analog value in the DAC amplifier unit 162 and then amplified. The amplified analog value is applied to the other of the pair of electrodes of the BLK deflector 212 as a beam deflecting voltage. Through the resistor 241 and the capacitor 251 which constitute a parallel circuit, an output value from the DAC amplifier unit 161 is added to an output value obtained from the DAC amplifier unit 162 through the resistor 242 and the capacitor 252 which similarly constitute a parallel circuit. The added analog value is amplified by the amplifier 262 and then input to the comparing circuit 272 connected to the amplifier 262. The output side of the comparing circuit 272 is connected to the judging circuit 182.

The distributing circuit 154 is connected through a bus (not shown) to the shaping deflection control circuit 144 which control a beam shape and a beam size. The distributing circuit 154 converts control signals from the shaping deflection control circuit 144 into a (+) signal and a (−) signal. One of the signals and the other are distributed to the DAC amplifier unit 163 and the DAC amplifier unit 164, respectively, in synchronism with each other. FIG. 1 shows an example in which the (+) signal is distributed to the DAC amplifier unit 163 while the (−) signal is distributed to the DAC amplifier unit 164. The output side of the DAC amplifier unit 163 is connected to one electrode of a pair of electrodes of the shaping deflector 205. The (+) signal is digital-analog converted (DA converted) into an analog value in the DAC amplifier unit 163 and then amplified. The amplified analog value is applied to one of the pair of electrodes of the shaping deflector 205 as a beam deflecting voltage. On the other hand, the output side of the DAC amplifier unit 164 is connected to the other of the pair of electrodes of the shaping deflector 205. The (−) signal is digital-analog converted (DA converted) into an analog value in the DAC amplifier unit 164 and then amplified. The amplified analog value is applied to the other of the pair of electrodes of the shaping deflector 205 as a beam deflecting voltage. Through the resistor 243 and the capacitor 253 which constitute a parallel circuit, an output value from the DAC amplifier unit 163 is added to an output value obtained from DAC amplifier unit 164 through the resistor 244 and the capacitor 254 which similarly constitute a parallel circuit. The added analog value is amplified by the amplifier 264 and then input to the comparing circuit 274 connected to the amplifier 264. The output side of the comparing circuit 274 is connected to the judging circuit 184.

The distributing circuit 156 is connected through a bus (not shown) to the position deflection control circuit 146 which control a beam shape and a beam size. The distributing circuit 156 converts control signals from the position deflection control circuit 146 into a (+) signal and a (−) signal. One of the signals and the other are distributed to the DAC amplifier unit 165 and the DAC amplifier unit 166, respectively, in synchronism with each other. FIG. 1 shows an example in which the (+) signal is distributed to the DAC amplifier unit 165 and the (−) signal is distributed to the DAC amplifier unit 166. The output side of the DAC amplifier unit 165 is connected to one electrode of a pair of electrodes of the objective deflector 208. The (+) signal is digital-analog converted (DA converted) into an analog value in the DAC amplifier unit 165 and then amplified. The amplified analog value is applied to one of the pair of electrodes of the objective deflector 208 as a beam deflecting voltage. On the other hand, the output side of the DAC amplifier unit 166 is connected to the other of the pair of electrodes of the objective deflector 208. The (−) signal is digital-analog converted (DA converted) into an analog value in the DAC amplifier unit 166 and then amplified. The amplified analog value is applied to the other of the pair of electrodes of the objective deflector 208 as a beam deflecting voltage. Through the resistor 245 and the capacitor 255 which constitute a parallel circuit, an output value from the DAC amplifier unit 165 is added to an output value obtained from DAC amplifier unit 166 through the resistor 246 and the capacitor 256 which similarly constitute a parallel circuit. The added analog value is amplified by the amplifier 266 and then input to the comparing circuit 276 connected to the amplifier 266. The output side of the comparing circuit 276 is connected to the judging circuit 186.

In FIG. 1, constituent elements required to explain the first embodiment are described. The writing apparatus 100 may include other configurations.

An electron beam 200 emitted from the electron gun assembly 201 illuminates an entire area of the first shaping aperture plate 203 having a rectangular, square, for example, hole with the illumination lens 202. In this case, the electron beam 200 is shaped to a rectangular shape, a square, for example. The electron beam 200 of a first aperture image having passed through the first shaping aperture plate 203 is projected on the second shaping aperture plate 206 by the projection lens 204. A position of the first aperture image projected on the second shaping aperture plate 206 is controlled by the statistic shaping deflector 205. As a result, a beam shape and a beam size can be changed. The electron beam 200 of a second aperture image having passed through the second shaping aperture plate 206 is focused by the objective lens 207. The electron beam 200 is deflected by the statistic objective deflector 208 and irradiates at a predetermined position of the target object 101 on the X-Y stage 105. For example, a case in which the target object 101 is a mask to manufacture a semiconductor device on a wafer will be described below.

Figure 2A:
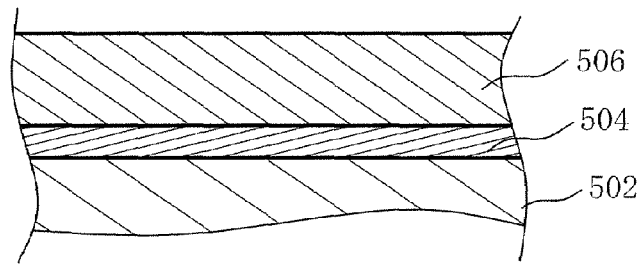
FIGS. 2A to 2D are diagrams showing main steps in manufacturing a mask in the first embodiment.
Figure 2B:
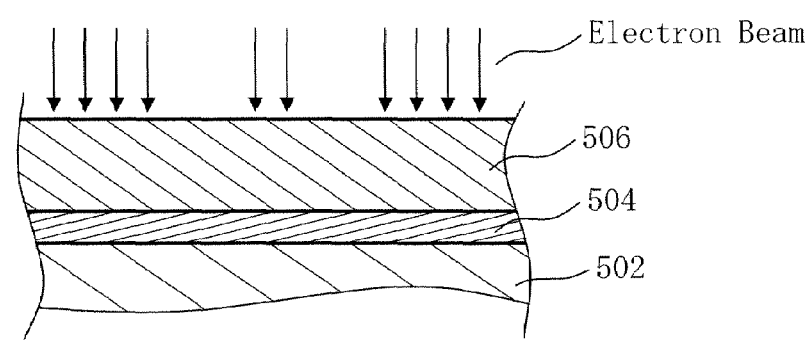
Figure 2C:
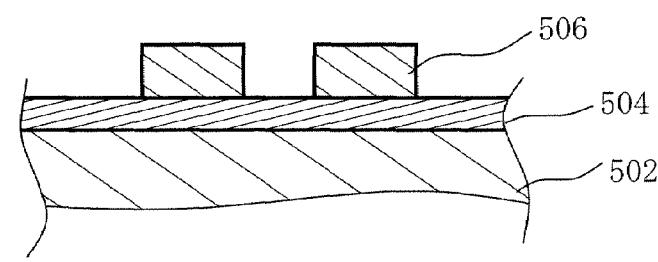
Figure 2D:
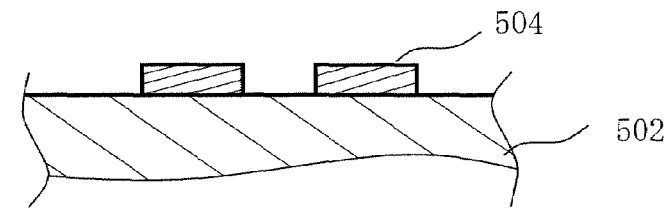

FIGS. 2A to 2D are diagrams showing main steps in manufacturing a mask in the first embodiment. As shown in FIG. 2A, a light-shielding film 504 such as a chromium (Cr) film is formed on a glass substrate 502 serving as the target object 101, and a resist film 506 is formed on the light-shielding film 504. As shown in FIG. 2B, the electron beam 200 is irradiated on the resist film by using the writing apparatus 100 in the first embodiment to expose the resist film 506. The target object 101 is developed and rinsed to form a resist pattern as shown in FIG. 2C. Subsequently, the underlying light-shielding film or the like is etched by using the resist pattern as a mask to form a mask pattern on the light-shielding film as shown in FIG. 2D. More specifically, a pattern is formed in the light-shielding film 504 written by the electron beam 200 deflected by the various deflectors. In this manner, the mask to manufacture a semiconductor device on a wafer is manufactured. In this case, although the light-shielding film is used, another film may be used. For example, a reflecting film used as a mask for EUV may be used. Alternatively, a phase-shift film may be used.

As described above, the electron beam 200 emitted from the electron gun assembly 201 irradiates the target object 101 on the X-Y stage 105 on a desired position on. In this case, as a method of irradiating the electron beam 200 on the target object 101 at a desired dose, the electron beam 200 is deflected by the statistic BLK deflector 212 and cut by the BLK aperture plate 214. In this manner, the electron beam 200 can be prevented from reaching the surface of the target object 101. In FIG. 1, a path of the electron beam 200 in case of blanking is indicated by a dotted line.

In a beam-ON (blanking-OFF) state, the electron beam 200 emitted from the electron gun assembly 201 traces a path indicated by a solid line in FIG. 1. On the other hand, in a beam-OFF (blanking-ON) state, the electron beam 200 emitted from the electron gun assembly 201 traces the path indicated by the dotted line in FIG. 1. The interior of the electron column 102 and the interior of the writing chamber 103 having the X-Y stage 105 arranged therein are evacuated to be set in a vacuum having a pressure lower than the atmospheric pressure.

Figure 3:
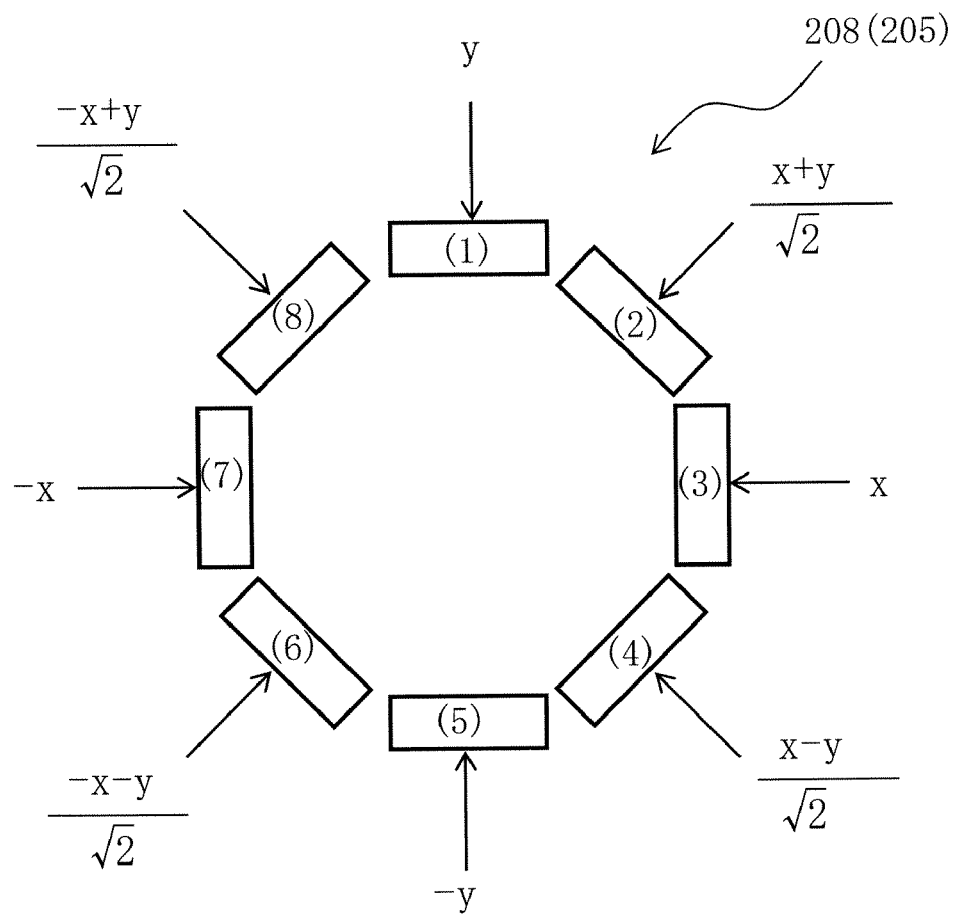
FIG. 3 is a diagram for explaining voltages applied to respective electrodes of deflectors according to the first embodiment.

FIG. 3 is a diagram for explaining voltages applied to respective electrodes of the deflectors according to the first embodiment.

In FIG. 3, an example of the shaping deflector 205 or the objective deflector 208 is shown. In this case, as an example, an 8-electrode statistic deflector is used. As shown in FIG. 3, for example, in order to deflect an electron beam in a predetermined position of X-Y directions, a voltage of y is applied to an electrode (1), a voltage of −y is applied to an electrode (5) serving as an antithetical of the electrode (1), a voltage of $(x+y)/\sqrt{2}$ is applied to an electrode (2), a voltage of $(-x-y)/\sqrt{2}$ is applied to an electrode (6) serving as an antithetical of the electrode (2), a voltage of x is applied to an electrode (3), a voltage of −x is applied to an electrode (7) serving as an antithetical of the electrode (3), a voltage of $(x-y)/\sqrt{2}$ is applied to an electrode (4), and a voltage of $(-x+y)/\sqrt{2}$ is applied to an electrode (8) serving as an antithetical of the electrode (4). In this manner, opposing voltages are applied to a pair of antithetical electrodes, respectively, to make it possible to realize high-speed and high-accurate beam deflection. In this case, although the 8-electrode electrostatic deflector is used as an example, another deflector may be used. Any deflector having a plurality of electrodes, i.e., two or more electrodes may be used. This is also applied to the BLK deflector 212. FIG. 1 shows a circuit Configuration related to one pair of deflectors. However, the circuit configuration includes a plurality of pairs (for example, four pairs in case of eight electrodes. More specifically, for example, when the shaping deflector 205 includes eight electrodes, four sets of DAC amplifier units 163, DAC amplifier units 164, comparing circuits 274, judging circuits 184, resistors 243, resistors 244, capacitors 253, capacitors 254, and amplifiers 264 are existing. The distributing circuit 154 may distribute necessary digital signals to the positive and negative DAC amplifier units of each of the combinations. When the objective deflector 208 includes eight electrodes, four sets of DAC amplifier units 165, DAC amplifier units 166, comparing circuits 276, judging circuits 186, resistors 245, amplifiers 264, capacitors 255, capacitors 256, and amplifiers 266 are included. The distributing circuit 156 may distribute necessary digital signals to positive and negative DAC amplifier units of each of the respective sets. The same is applied to the BLK deflector 212.

Figure 4:
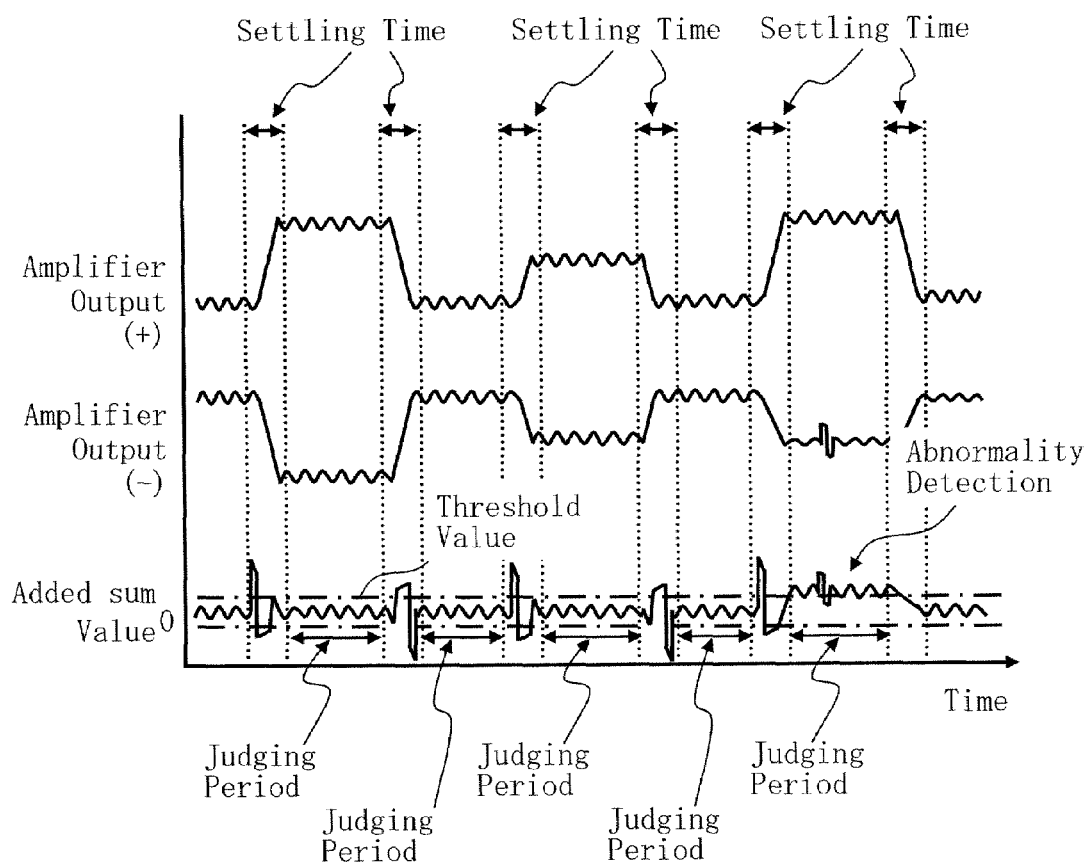
FIG. 4 is a diagram showing an example of a DAC amplifier output and an added sum in the first embodiment.

FIG. 4 is a diagram showing an example of a DAC amplifier output and an added sum in the first embodiment.

In the first embodiment, the DAC amplifier unit 161 receives, from the distributing circuit 152, a (+) digital signal for electro statically deflecting the electron beam 200 to blank the electron beam 200. The DAC amplifier unit 161 converts the digital signal into an analog value. When the DAC amplifier unit 161 converts the digital signal into an analog value, amplifies the analog value, outputs the amplified analog value to the BLK deflector 212 as a (+) voltage value, a signal having a (+) voltage value is branched to the comparing circuit 272. The DAC amplifier unit 161 serves as an example of a first DA converter unit. The (+) analog value serves as an example of a first analog value. A (+) voltage value obtained by amplifying the analog value serves as an example of a first voltage value.

Similarly, the DAC amplifier unit 162 (one example of a second DA converter unit) receives, from the distributing circuit 152, a (−) digital signal for electro statically deflecting the electron beam 200 to blank the electron beam 200. When the DAC amplifier unit 162 converts the digital signal into an analog value, amplifies the analog value, and outputs the amplified analog value to the BLK deflector 212 as a (−) voltage value (second voltage value), a signal having the (−) voltage value is branched to the comparing circuit 272. The DAC amplifier unit 162 serves as an example of a second DA converter unit. The (−) analog value serves as an example of a second analog value. A (−) voltage value obtained by amplifying the analog value serves as an example of a second voltage value.

The voltage values are added to each other to output an added sum to the comparing circuit 272. When the two digital signals, the polarities of which are opposite, are input to the DAC amplifier units, respectively, output values from the DAC amplifier units have exactly opposite wave shapes if the DAC amplifier units are same in design. Therefore, when the two output values are added to each other, an added sum is 0 ideally. On the other hand, when at least one of the DAC amplifier unit 161 and the DAC amplifier unit 162 is abnormal, the added sum is not 0. Therefore, the comparing circuit 272 compares the added sum with a predetermined threshold value (reference voltage). For example, when the added sum exceeds the predetermined threshold value as a result of comparison, an H-level signal is output to the judging circuit 182. When the added sum does not exceed the predetermined threshold value, an L-level signal is output to the judging circuit 182. The judging circuit 182 processes an output value from the comparing circuit 272 to judge normality/abnormality. A combination of the comparing circuit 272 and the judging circuit 182 serves as an example of a judging unit. More specifically, the judging circuit 182 processes the output value from the comparing circuit 272 to judge whether or not the added sum exceeds the predetermined threshold value. When the added sum exceeds the predetermined threshold value, it is judged that at least one of the DAC amplifier unit 161 and the DAC amplifier unit 162 is abnormal, and the result is output to the control computer 120. With this configuration, an abnormal state, where at least one of the DAC amplifier unit 161 and the DAC amplifier unit 162 is abnormal, can be immediately detected. Since an analog value generally includes noise as shown in FIG. 4, the predetermined threshold value is used in decision to make it possible to reduce erroneous judgments. When the noise is small or negligible, the threshold value may be set at 0 or approximately 0. As described above, the added sum is processed by the comparing circuit 272 and the judging circuit 182, which serve as the judging unit, to make it possible to judge that at least one of the DAC amplifier unit 161 and the DAC amplifier unit 162 is abnormal.

In this case, in a settling time area where an output value from the DAC amplifier unit reaches a target value, the added sum may be large to some extent. However, this phenomenon is different from the abnormality of the DAC amplifier unit. Therefore, the threshold value judgment is prevented from being performed within the settling time. The added sum may exceed the threshold value due to not only an offset but also noise as shown in FIG. 4.

Furthermore, the value is amplified by the amplifier 262 to make it possible to clarify a difference between the value and the threshold value (reference voltage) serving as a reference. This allows the accuracy of comparison in the comparing circuit 272 to be improved. In particular, even though the level of abnormality of the DAC amplifier is small, the abnormality can be detected by amplifying the added sum.

Similarly, the DAC amplifier unit 163 receives, from the distributing circuit 154, a (+) digital signal for electro statically deflecting the electron beam 200 to shape the electron beam 200. When the DAC amplifier unit 163 converts the digital signal into an analog value, amplifies the analog value, and outputs the amplified analog value to the shaping deflector 205 as a (+) voltage value, a signal having a (+) voltage value is branched to the comparing circuit 274. The DAC amplifier unit 163 serves as an example of a first DA converter unit. The (+) analog value serves as an example of a first analog value. A (+) voltage value obtained by amplifying the analog value serves as an example of a first voltage value.

Similarly, the DAC amplifier unit 164 receives, from the distributing circuit 154, a (−) digital signal for electro statically deflecting the electron beam 200 to shape the electron beam 200. When the DAC amplifier unit 164 converts the digital signal into an analog value, amplifies the analog value, and outputs the amplified analog value to the shaping deflector 205 as a (−) voltage value, a signal having a (−) voltage value is branched to the comparing circuit 274. The DAC amplifier unit 164 serves as an example of a second DA converter unit. The (−) analog value serves as an example of a second analog value. A (−) voltage value obtained by amplifying the analog value serves as a second voltage value.

These voltages are added to each other to output an added sum to the comparing circuit 274. As described above, when the two digital signals the polarities of which are opposite are input to the DAC amplifier units, respectively, output values from the DAC amplifier units have exactly opposite wave shapes if the DAC amplifier units are same in design. Accordingly, when the two output values are added an added sum is 0 ideally. On the other hand, when at least one of the DAC amplifier unit 163 and the DAC amplifier unit 164 is abnormal, the added sum is not 0. Therefore, the comparing circuit 274 compares the added sum with a predetermined threshold value (reference voltage). For example, when the added sum exceeds the predetermined threshold value as a result of comparison, an H-level signal is output to the judging circuit 184. When the added sum does not exceed the predetermined threshold value, an L-level signal is output to the judging circuit 184. The judging circuit 184 processes an output value from the comparing circuit 274 to judge normality/abnormality. A combination of the comparing circuit 274 and the judging circuit 184 serves as an example of a judging unit. More specifically, the judging circuit 184 processes the output value from the comparing circuit 274 to judge whether or not the added sum exceeds the predetermined threshold value. When the added sum exceeds the predetermined threshold value, it is judged that at least one of the DAC amplifier unit 163 and the DAC amplifier unit 164 is abnormal, and the result is output to the control computer. With this configuration, an abnormal sate, where the case in which at least one of the DAC amplifier unit 163 and the DAC amplifier unit 164 is abnormal, can be immediately detected. Since an analog value generally includes noise as shown in FIG. 4, the predetermined threshold value is used in decision to make it possible to reduce erroneous judgments. When the noise is small or negligible, the threshold value may be set at 0 or approximately 0. As described above, the added sum is judged by the comparing circuit 274 and the judging circuit 184, which serve as the judging unit, to make it possible to judge that at least one of the DAC amplifier unit 163 and the DAC amplifier unit 164 is abnormal. The resistor and the capacitor are arranged as in the BLK deflection described above. Furthermore, the value is amplified by the amplifier 264 to make it possible to clarify a difference between the value and the threshold value (reference voltage) serving as a reference. This allows the accuracy of comparison in the comparing circuit 274 to be improved. In particular, even though the level of abnormality of the DAC amplifier is small, the abnormality can be detected by amplifying the added sum.

Similarly, the DAC amplifier unit 165 receives, from the distributing circuit 156, a (+) digital signal for electro statically deflecting the electron beam 200 to position the electron beam 200 on the target object. When the DAC amplifier unit 165 converts the digital signal into an analog value, amplifies the analog value, and outputs the amplified analog value to the objective deflector 208 as a (+) voltage value, a signal having a (+) voltage value is branched to the comparing circuit 276. The DAC amplifier unit 165 serves as an example of a first DA converter unit. The (+) analog value serves as an example of a first analog value. A (+) voltage value obtained by amplifying the analog value serves as a first voltage value.

Similarly, the DAC amplifier unit 166 receives, from the distributing circuit 156, a (−) digital signal for electro statically deflecting the electron beam 200 to position the electron beam 200 on the target object. When the DAC amplifier unit 166 converts the digital signal into an analog value, amplifies the analog value, and outputs the amplified analog value to the objective deflector 208 as a (−) voltage value, a signal having a (−) voltage value is branched to the comparing circuit 276. The DAC amplifier unit 165 serves as an example of a second DA converter unit. The (−) analog value serves as an example of a second analog value. A (−) voltage value obtained by amplifying the analog value serves as a second voltage value.

These voltages are added to each other to output an added sum to the comparing circuit 276. As described above, when the two digital signals, the polarities of which are opposite, are input to the DAC amplifier units, respectively, output values from the DAC amplifier units have exactly opposite wave shapes ideally if the DAC amplifier units are same in design. Accordingly, when the two output values are added to each other an added sum is 0 ideally. On the other hand, when at least one of the DAC amplifier unit 165 and the DAC amplifier unit 166 is abnormal, the added sum is not 0. Therefore, the comparing circuit 276 compares the added sum with a predetermined threshold value (reference voltage). For example, when the added sum exceeds the predetermined threshold value as a result of comparison, an H-level signal is output to the judging circuit 186. When the added sum does not exceed the predetermined threshold value, an L-level signal is output to the judging circuit 186. The judging circuit 186 processes an output value from the comparing circuit 276 to judge normality/abnormality. A combination of the comparing circuit 276 and the judging circuit 186 serves as an example of a judging unit. More specifically, the judging circuit 186 processes the output value from the comparing circuit 276 to judge whether or not the added sum exceeds the predetermined threshold value. When the added sum exceeds the predetermined threshold value, it is judged that at least one of the DAC amplifier unit 165 and the DAC amplifier unit 166 is abnormal, and the result is output to the control computer 120. With this configuration, abnormal state, where at least one of the DAC amplifier unit 165 and the DAC amplifier unit 166 is abnormal can be immediately detected. Since an analog value generally includes noise as shown in FIG. 4, the predetermined threshold value is used in decision to make it possible to reduce erroneous determinations. When the noise is small or negligible, the threshold value may be set at 0 or approximately 0. As described above, the added sum is processed by the comparing circuit 276 and the judging circuit 186, which serve as the judging unit, to make it possible to judge that at least one of the DAC amplifier unit 165 and the DAC amplifier unit 166 is abnormal. The resistor and the capacitor are arranged as in the BLK deflection and the shaping deflection described above. Furthermore, the value is amplified by the amplifier 266 to make it possible to clarify a difference between the value and the threshold value (reference voltage) serving as a reference. This allows the accuracy of comparison in the comparing circuit 276 to be improved. In particular, even though the level of abnormality of the DAC amplifier is small, the abnormality can be detected by being amplified.

As described above, when the electron beam 200 is controlled in deflection by plus-minus reversed voltage values of a pair of electrodes, output values from the DAC amplifier units are added to each other to make it possible to detect abnormality of at least one of the DAC amplifier units. If it is known that at least one of the DAC amplifier units is abnormal, when any one of the DAC amplifier units is replaced with new one to perform a test again, it can be judged which one of the DAC amplifier units is abnormal. In other words, a writing operation is performed again in a state in which abnormality occurs to confirm that the abnormality occurs. One of the pair of antithetical DAC amplifier units is replaced with another DAC amplifier unit to perform test again. If abnormality reappears, it is found that the unreplaced DAC amplifier unit is abnormal. If abnormality does not reappear, the replaced DAC amplifier unit is returned, the other DAC amplifier unit is replaced with the removed DAC amplifier unit, and the test is performed again. If abnormality reappears, it is found that the DAC amplifier unit which is replaced first (at the present, the unreplaced DAC amplifier unit) is abnormal.

In the first embodiment, outputs from the antithetical DAC amplifier units are added to each other. However, the invention is not limited to the configuration in which outputs from one pair of antithetical DAC amplifier units are added to each other. For example, when a deflector has four electrodes, there are two pairs of antithetical DAC amplifier units. When a deflector has eight electrodes, there are four pairs of antithetical DAC amplifier units. In this case, even when outputs from each pair of DAC amplifier units are added, an added sum is 0 if no abnormality or error occurs. Therefore, when outputs from all or several pairs of DAC amplifier units are added, an added sum is 0 if no abnormality or error occurs. For this reason, a configuration in which outputs from all or several pairs of DAC amplifier units are added to each other is preferably used.

According to the configuration of the first embodiment, an abnormality can be detected while writing a pattern (during writing). Furthermore, regardless of the presence/absence of repeatability, abnormality can be detected when the abnormality or error occurs. This makes it possible to prevent secondary damage in which abnormal masks or abnormal wafers, etc. are continuously unconsciously manufactured.

Second Embodiment

The first embodiment describes the configuration which can detect that at least one of the antithetical DAC amplifiers is abnormal. However, the second embodiment will describe a configuration which can independently identify an abnormal DAC amplifier of a pair of antithetical DAC amplifiers. The second embodiment will describe a case in which, as a representative of three deflectors including a BLK deflector 212, a shaping deflector 205, and an objective deflector 208 which perform beam deflection, an abnormal DAC amplifier for the objective deflector 208 is detected. With respect to the BLK deflector 212 and the shaping deflector 205 as well, abnormal DAC amplifiers can be independently identified by using the same configuration as that for the objective deflector 208. Therefore, descriptions for the DAC amplifier of the BLK deflector 212 the shaping deflector 205 will be omitted.

Figure 5:
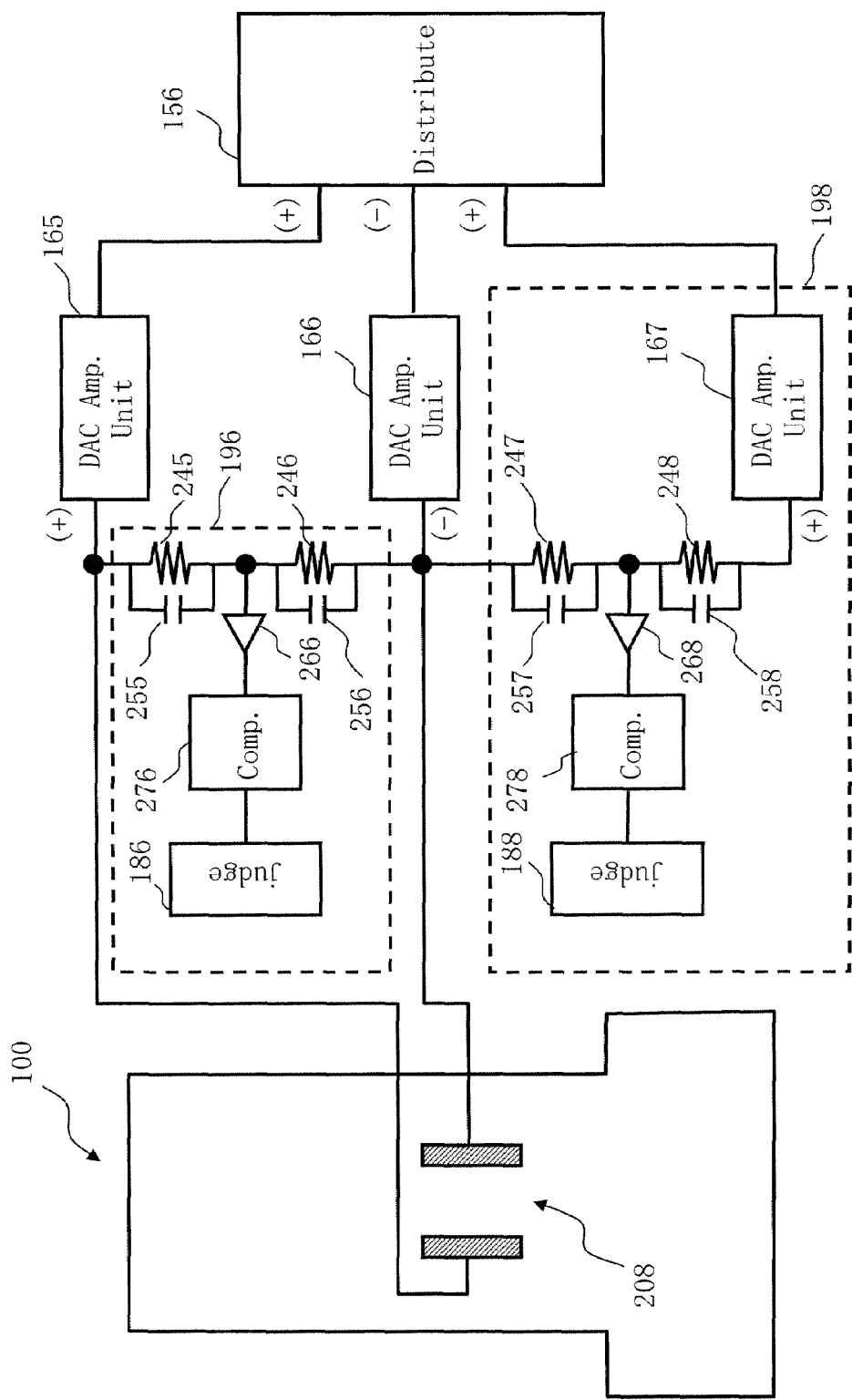
FIG. 5 is a conceptual diagram showing a configuration of a writing apparatus according to a second embodiment.

FIG. 5 is a conceptual diagram showing a configuration of a writing apparatus according to the second embodiment.

In FIG. 5, of the BLK deflector 212, the shaping deflector 205, and the objective deflector 208, the objective deflector 208 is representatively shown. A writing apparatus 100 according to the second embodiment, includes, in addition to the objective deflector 208, a distributing circuit 156, a DAC amplifier unit 165, and a DAC amplifier unit 166, an abnormality detecting unit 196 related to abnormality detection for the objective deflector 208 and an abnormality detecting mechanism 198 for test. The writing apparatus 100 according to the second embodiment has the same configuration as that in FIG. 1 except that the abnormality detecting mechanism 198 is further arranged for test. The writing apparatus 100 includes, as the abnormality detecting mechanism 198 for test, a DAC amplifier unit 167, a comparing circuit 278, a judging circuit 188, a resistor 247, a resistor 248, a capacitor 257, a capacitor 258, and an amplifier 268. The writing apparatus 100 also includes, as the abnormality detecting mechanism 196, a comparing circuit 276, a judging circuit 186, a resistor 245, a resistor 246, a capacitor 255, a capacitor 256, and an amplifier 266. In FIG. 5, a description of a configuration except for the objective deflector 208, the distributing circuit 156, the DAC amplifier unit 165, the DAC amplifier unit 166, the comparing circuit 276, the judging circuit 186, the resistor 245, the resistor 246, the capacitor 255, the capacitor 256, and the amplifier 266 will be omitted. In FIG. 5, constituent parts necessary to explain the second embodiment are shown. The writing apparatus 100 may further include other configurations.

To the upstream side of the distributing circuit 156, a position deflection control circuit 146 for controlling a beam position in FIG. 1 is connected through a bus (not shown). The distributing circuit 156 converts control signals from the position deflection control circuit 146 into a (+) signal and a (−) signal, respectively. One of the signals and the other are distributed to the DAC amplifier unit 165 and the DAC amplifier unit 166, respectively, in synchronism with each other. FIG. 5 shows an example in which the (+) signal is distributed to the DAC amplifier unit 165 while the (−) signal is distributed to the DAC amplifier unit 166. In this case, furthermore, the (+) signal is also distributed to the DAC amplifier unit 167 while synchronizing signal outputs to the DAC amplifier unit 165 and the DAC amplifier unit 166 with each other. As described in the first embodiment, the output side of the DAC amplifier unit 165 is connected one electrode of a pair of electrodes of the objective deflector 208. The (+) signal is digital-analog converted (DA converted) in the DAC amplifier unit 165 and then amplified. The amplified analog value is applied to one of the pair of electrodes of the objective deflector 208 as a beam deflecting voltage. On the other hand, the output side of the DAC amplifier unit 166 is connected to the other of the pair of electrodes of the objective deflector 208. The (−) signal is digital-analog converted (DA converted) in the DAC amplifier unit 166 and then amplified. The amplified analog value is applied to the other of the pair of electrodes of the objective deflector 208 as a beam deflecting voltage. As described in the first embodiment, an output value obtained from the DAC amplifier unit 165 through the resistor 245 and the capacitor 255 which constitute a parallel circuit is added to an output value obtained from the DAC amplifier unit 166 through the resistor 246 and the capacitor 256 which similarly constitute a parallel circuit. The added analog value is amplified by the amplifier 266 and then input to the comparing circuit 276 connected to the amplifier 266. The output side of the comparing circuit 276 is connected to the judging circuit 186. In the second embodiment, the output value from the DAC amplifier unit 166 is further branched before the output value is connected to the resistor 246 and the capacitor 256, and then added, through the resistor 247 and the capacitor 257 which constitute a parallel circuit, to the output value obtained from the DAC amplifier unit 167 through the resistor 248 and the capacitor 258 which similarly constitute a parallel circuit. The added analog value is amplified by the amplifier 268 and then input to the comparing circuit 278 connected to the amplifier 268. The output side of the comparing circuit 278 is connected to the judging circuit 188.

In this case, in order to add an output from the DAC amplifier unit 166 which receives the (−) signal to an output from the DAC amplifier unit 167, the DAC amplifier unit 167 receives the (+) signal. However, the invention is not limited to this configuration. When an output from the DAC amplifier unit which receives a (+) signal is added to an output from the DAC amplifier unit 167, the DAC amplifier unit 167 receives a (−) signal. More specifically, a signal the polarity of which is opposite to that of a value to be added is input from the distributing circuit 156.

As in the first embodiment, the objective deflector 208 may be constituted by a plurality electrodes such as eight electrodes. FIG. 5 shows two electrodes which are paired. For example, when the objective deflector 208 is constituted by eight electrodes, four pairs of two electrodes which are paired are used. For this reason, four combinations of DAC amplifier units 167, comparing circuits 278, judging circuits 188, resistors 247, resistors 248, capacitors 257, capacitors 258, and amplifiers 268 are prepared and connected by the same manner as described above. Alternatively, as the DAC amplifier unit 167, a DAC amplifier unit in another combination may be preferably diverted.

As described in the first embodiment, the DAC amplifier unit 165 receives a (+) digital signal to statistically deflect the electron beam 200 from the distributing circuit 156 and converts the digital signal into an analog signal. When the analog value is amplified and output to the objective deflector 208 as a (+) voltage value, a signal having a (+) voltage value is branched to the comparing circuit 276. The DAC amplifier unit 165 serves as an example of a first DA converter unit. The (+) analog value serves as an example of a first analog value. A (+) voltage value obtained by amplifying the analog value serves as an example of a first voltage value.

Similarly, the DAC amplifier unit 166 receives, from the distributing circuit 156, a (−) digital signal for statistically deflecting the electron beam 200 and converts the digital signal into an analog signal. When the analog value is amplified and output to the objective deflector 208 as a (−) voltage value, a signal having a (−) voltage value is branched to the comparing circuit 276. The DAC amplifier unit 166 serves as an example of a second DA converter unit. The (−) analog value serves as an example of a second analog value. A (−) voltage value obtained by amplifying the analog value serves as an example of a second voltage value.

These voltage values are added to each other to output an added sum to the comparing circuit 276. As described above, when the two digital signals, the polarities of which are opposite, are input to the DAC amplifier units, respectively, output values from the DAC amplifier units have exactly opposite wave shapes ideally if the DAC amplifier units are same in design. Accordingly, when the two output values are added to each an added sum is 0 ideally. On the other hand, when at least one of the DAC amplifier unit 165 and the DAC amplifier unit 166 is abnormal, the added sum is not 0. Therefore, the comparing circuit 276 compares the added sum with a Predetermined threshold value (reference voltage). For example, when the added sum exceeds the predetermined threshold value as a result of comparison, an H-level signal is output to the judging circuit 186. When the added sum does not exceed the predetermined threshold value, an L-level signal is output to the judging circuit 186. The judging circuit 186 processes an output value from the comparing circuit 276 to judge normality/abnormality. A combination of the comparing circuit 276 and the judging circuit 186 serves as an example of a judging unit. More specifically, the judging circuit 186 processes the output value from the comparing circuit 276 to judge whether or not the added sum exceeds the predetermined threshold value. When the added sum exceeds the predetermined threshold value, it is judged that at least one of the DAC amplifier unit 165 and the DAC amplifier unit 166 is abnormal, and the result is output to the control computer 120. With this configuration, an abnormal sate, where at least one of the DAC amplifier unit 165 and the DAC amplifier unit 166 is abnormal, can be immediately detected.

Similarly, the DAC amplifier unit 166 receives, from the distributing circuit 156, a (−) digital signal to statistically deflect the electron beam 200 and converts the digital signal into an analog signal. When the analog value is amplified and output to the objective deflector 208 as a (−) voltage value, a signal having a (−) voltage value is branched to the comparing circuit 276. The DAC amplifier unit 166 serves as an example of a second DA converter unit. The (−) analog value serves as an example of a second analog value. A (−) voltage value obtained by amplifying the analog value serves as an example of a second voltage value.

The DAC amplifier unit 167 receives, from the distributing circuit 156, a (+) digital signal for statistically deflecting the electron beam 200 and converts the digital signal into an analog signal. When the analog value is amplified and output to the objective deflector 208 as a (+) voltage value, a signal having a (+) voltage value is branched to the comparing circuit 276. The DAC amplifier unit 167 serves as an example of a third DA converter unit. The (+) analog value serves as an example of a third analog value. A (+) voltage value obtained by amplifying the analog value serves as an example of a third voltage value.

These voltage values are added to each other to output an added sum to the comparing circuit 278. As described above, when the two digital, signals the polarities of which are opposite, are input to the DAC amplifier units, respectively, output values from the DAC amplifier units have exactly opposite wave shapes ideally if the DAC amplifier units are same in design. Accordingly, when the two output values are added to each other an added sum is 0 ideally. On the other hand, when at least one of the DAC amplifier unit 166 and the DAC amplifier unit 167 is abnormal, the added sum is not 0. Therefore, the comparing circuit 278 compares the added sum with a predetermined threshold value (reference voltage). For example, when the added sum exceeds the predetermined threshold value as a result of comparison, an H-level signal is output to the judging circuit 188. When the added sum does not exceed the predetermined threshold value, an L-level signal is output to the judging circuit 188. The judging circuit 188 processes an output value from the comparing circuit 278 to judge normality/abnormality. A combination of the comparing circuit 278 and the judging circuit 188 serves as an example of a judging unit. More specifically, the judging circuit 188 processes the output value from the comparing circuit 278 to judge whether or not the added sum exceeds the predetermined threshold value. When the added sum exceeds the predetermined threshold value, it is judged that at least one of the DAC amplifier unit 166 and the DAC amplifier unit 167 is abnormal, and the result is output to the control computer 120. With this configuration, an abnormal sate, where at least one of the DAC amplifier unit 166 and the DAC amplifier unit 167 is abnormal, can be immediately detected.

When the judging circuit 186 detects abnormality and the judging circuit 188 detects a normal state without detecting abnormality, it can be identified that the DAC amplifier unit 165 is abnormal. In contrast to this, when the judging circuit 186 detects a normal state without detecting abnormality and the judging circuit 188 detects abnormality, it can be identified that the DAC amplifier unit 167 serving as a DAC amplifier for test is abnormal. Furthermore, when the judging circuit 186 detects abnormality and the judging circuit 188 detects abnormality, it can be estimated that the DAC amplifier unit 166 is abnormal. In general, it is practically improbable that both the DAC amplifier unit 165 and the DAC amplifier unit 166 function abnormally at the same time. For this reason, in this case, it may be identified that the DAC amplifier unit 166 is abnormal.

As described above, when two judging results obtained by sharing an output from one of the DAC amplifier units are used, one of the pair of DAC amplifier units can be identified as an abnormal DAC amplifier unit.

The following points can be obtained as in the first embodiment. That is, since an analog value generally includes noise as shown in FIG. 4, the predetermined threshold value is used in decision to make it possible to reduce erroneous determinations. When the noise is small or negligible, the threshold value may be set at 0 or approximately 0. Furthermore, as in the first embodiment, when outputs from the DAC amplifier units are added to each other through resistors and capacitors which constitute a parallel circuit.

The case in which an abnormal DAC amplifier for the objective deflector 208 as a representative of three deflectors including the BLK deflector 212, the shaping deflector 205, and the objective deflector 208 which perform beam deflection is detected is described here. However, the invention is not limited to the case. When the BLK deflector 212 and the shaping deflector 205 have the same configuration as described above each, abnormal DAC amplifier units can be independently identified as described above.

Third Embodiment

Figure 6:
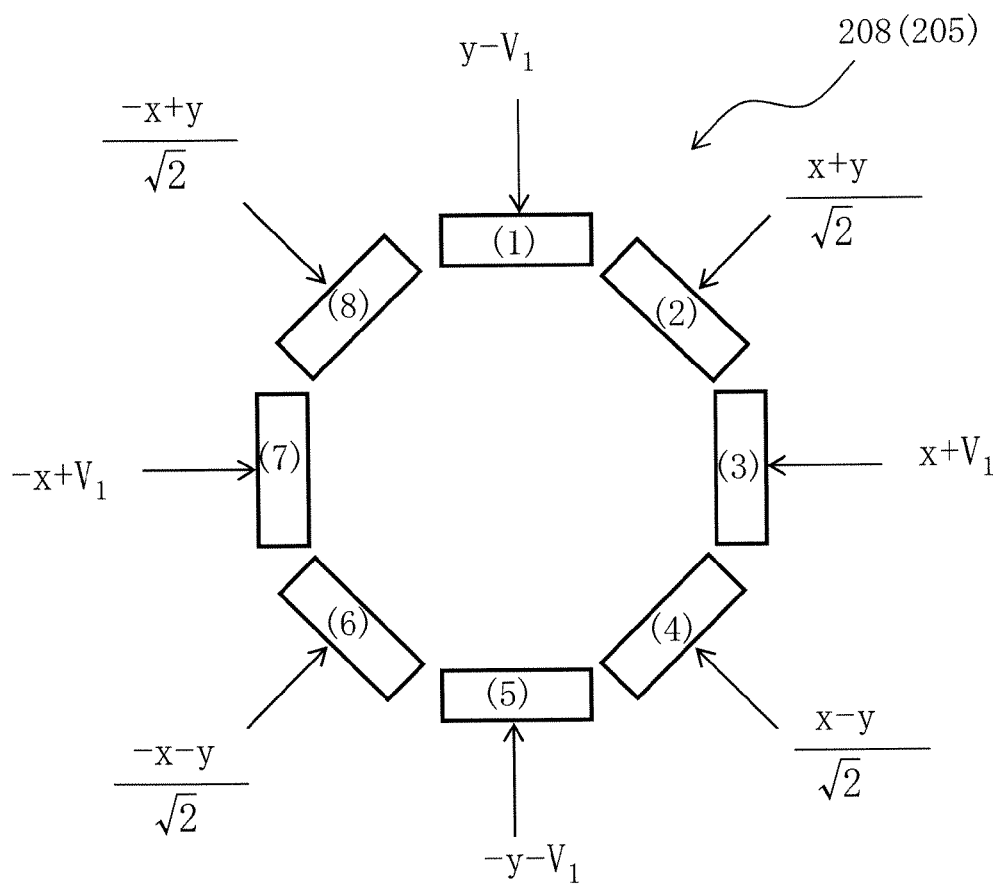
FIG. 6 is a diagram for explaining voltages applied to respective electrodes of deflectors according to a third embodiment.

FIG. 6 is a diagram for explaining voltages applied to respective electrodes of deflectors according to a third embodiment.

As in FIG. 3, FIG. 6 shows an example of the shaping deflector 205 or the objective deflector 208. In this case, as in FIG. 3, 8-electrode electrostatic deflectors will be described below as an example. As described above in FIG. 3, for example, in order to deflect an electron beam in a predetermined position of X-Y directions, a voltage of y is applied to an electrode (1), a voltage of −y is applied to an electrode (5) serving as an antithetical of the electrode (1), a voltage of $(x+y)/\sqrt{2}$ is applied to an electrode (2), a voltage of $(-x-y)/\sqrt{2}$ is applied to an electrode (6) serving as an antithetical of the electrode (2), a voltage of x is applied to an electrode (3), a voltage of −x is applied to an electrode (7) serving as an antithetical of the electrode (3), a voltage of $(x-y)/\sqrt{2}$ is applied to an electrode (4), and a voltage of $(-x+y)/\sqrt{2}$ is applied to an electrode (8) serving as an antithetical of the electrode (4). More specifically, opposing voltages are applied to a pair of antithetical electrodes, respectively, to make it possible to realize high-speed and high-accurate beam deflection. In this case, in addition to the voltages described above, a correction voltage may be applied in order to correct astigmatism or focus of the electron beam 200. FIG. 6 shows a case in which a voltage of $-V_1$ is applied to the pair of the antithetical electrodes (1) and (5), and a voltage of $+V_1$ is applied to the pair of the antithetical electrode (3) and (7).

When the correction voltages are applied in this manner, voltages applied to two antithetical electrodes are not opposing voltages. When the voltages applied to the pair of antithetical electrodes are not opposing voltages, abnormality of the DAC amplifier units may not be detected at high accuracy in the embodiments described above. The third embodiment will describe a configuration in which abnormality of the DAC amplifier units can be detected at high accuracy even in such a case.

In the third embodiment, abnormality is not detected by using a pair of two DAC amplifier units or three or more DAC amplifier units, but abnormality in each DAC amplifier unit is independently detected.

Figure 7:
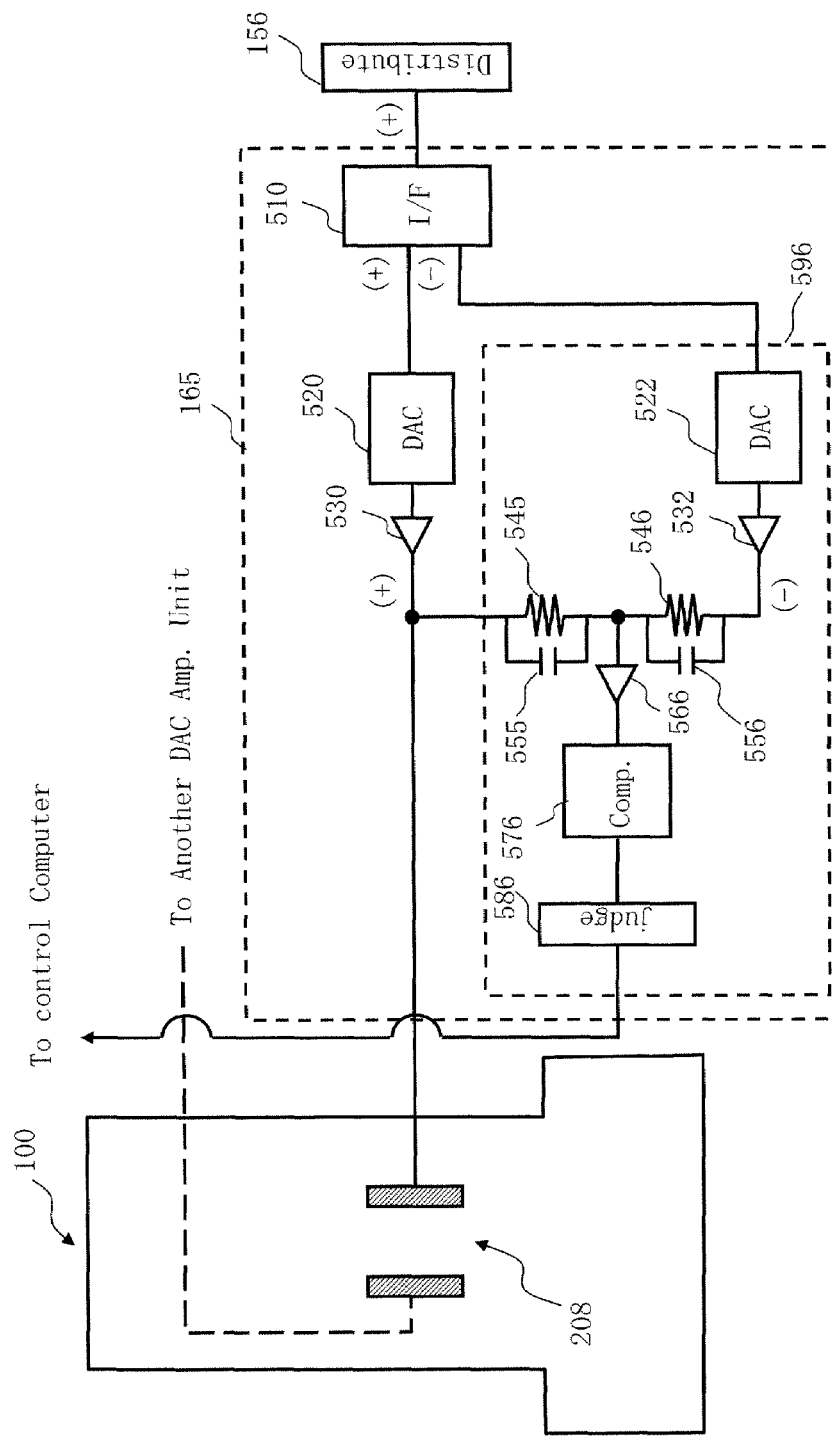
FIG. 7 is a conceptual diagram showing a configuration of a writing apparatus according to the third embodiment.

FIG. 7 is a conceptual diagram showing a configuration of a writing apparatus according to the third embodiment.

The third embodiment describes a case in which an abnormal DAC amplifier for the objective deflector 208 as a representative of three deflectors including a BLK deflector 212, the shaping deflector 205, and the objective deflector 208 which perform beam deflection is detected. The BLK deflector 212 and the shaping deflector 205 each have the same configuration as that of the objective deflector 208 can similarly identify an abnormal DAC amplifier unit. Furthermore, a case in which abnormality of the DAC amplifier for the objective deflector 208 is detected will be described with respect to the DAC amplifier unit 165 which applies a voltage to one electrode of the objective deflector 208. A DAC amplifier unit which applies a voltage to the other electrode has the same configuration as that of the DAC amplifier unit 165 to make it possible to identify an abnormal DAC amplifier unit.

Of the BLK deflector 212, the shaping deflector 205 and the objective deflector 208, the objective deflector 208 is representatively shown in FIG. 7. An abnormality detecting mechanism 596 is arranged in a DAC amplifier unit which applies a voltage to one electrode of the objective deflector 208. In this case, for example, the DAC amplifier unit 165 will be described. The DAC amplifier unit 165 includes an I/F (interface) circuit 510 which processes a signal from the distributing circuit 156, a digital-analog converter (DAC) 520, and an amplifier 530. Furthermore, the DAC amplifier unit 165 includes, as the abnormality detecting mechanism 596, a DAC 522, an amplifier 532, a comparing circuit 576, a judging circuit 586, a resistor 545, a resistor 546, a capacitor 555, a capacitor 556, and an amplifier 566. The configuration in FIG. 7 is the same as that in FIG. 1 except that, in place of the abnormality detecting mechanism 192, the abnormality detecting mechanism 194 and the abnormality detecting unit 196 in FIG. 1, the abnormality detecting mechanism 596 is arranged in each of the DAC amplifier units. FIG. 7 describes, as an example, the DAC amplifier unit 165 which applies a voltage to one electrode of the objective deflector 208, and other configurations are omitted. In FIG. 7, constituent elements necessary to explain the third embodiment are described. The writing apparatus 100 may further include other configurations.

To the upstream side of the distributing circuit 156, a position deflection control circuit 146 for controlling a beam position in FIG. 1 is connected through a bus (not shown). The distributing circuit 156 converts control signals from the position deflection control circuit 146 into a (+) signal and a (−) signal, respectively. One of the signals and the other are distributed to the DAC amplifier unit 165 and the DAC amplifier unit 166, respectively. In FIG. 7, as in FIG. 1, the (+) signal is distributed to the DAC amplifier unit 165 by way of example. In the DAC amplifier unit 165, the I/F circuit 510 processes a digital (+) signal to perform timing generation, an insulating process and the like as well as generates a (+) signal and a (−) signal as outputs. The (+) signal to be applied to a certain electrode of the objective deflector 208 is distributed to the DAC 520, and the remaining (−) signal is applied to the DAC 522 in synchronism with each other. The (+) signal is digital-analog converted (DA converted) to the DAC 520 and amplified by the amplifier 530 connected to the output of the DAC 520. A combination mechanism of the DAC 520 and the amplifier 530 serves as an example of a first DA converter unit. An output from the amplifier 530 is connected to one electrode of the objective deflector 208. An amplified analog value is applied to one electrode of the objective deflector 208 as a beam deflection voltage. On the other hand, the other DAC amplifier unit is connected to the other electrode of the pair of electrodes of the objective deflector 208. On this side, the input (−) signal is digital-analog converted (DA converted) and amplified by the amplifier 532 connected to the output of the DAC 522. A combination mechanism of the DAC 522 and the amplifier 532 serves as one example of a second DAC converter unit.

In the DAC amplifier unit 165, an output value from the amplifier 530 is added to an output value from the amplifier 532, through the resistor 545 and the capacitor 555 which constitute a parallel circuit, and through the resistor 546 and the capacitor 556 respectively. The added analog value is amplified by the amplifier 566 and input to the comparing circuit 576 connected to the amplifier 566. The output side of the comparing circuit 576 is connected to the judging circuit 586.

In this case, in order to add an output from the DAC 520 which receives a (+) signal to an output from the DAC 522, a (−) signal is input to the DAC 522. However, another configuration may be used. When the output from the DAC 520 which receives the (−) signal is added to the output from the DAC 522, a (+) signal is input to the DAC 522.

In this case, the DAC 520 receives, from the I/F circuit 510, a (+) digital signal for electro statically deflecting the electron beam 200. The DAC 520 converts the digital signal into an analog value. When the amplifier 530 amplifies the analog value and outputs the amplified analog value to the objective deflector 208 as a (+) voltage value (first voltage value), a signal having a (+) voltage value is branched to the comparing circuit 576. The (+) analog value serves as an example of a first analog value. A (+) voltage value obtained by amplifying the analog value serves as an example of a first voltage value.

Similarly, the (−) digital signal the polarity of which is reversed by the DAC 522 is input from the I/F circuit 510. The (−) digital signal is converted into an analog value. The analog value is amplified by the amplifier 532 to output a signal of a (−) voltage value to the comparing circuit 576 as a (−) voltage value (second voltage value). The voltage values are added to each other to output an added sum to the comparing circuit 576. The (−) analog value serves as an example of a second analog value. A (−) voltage value obtained by amplifying the analog value serves as an example of a second voltage value.

In this manner, when the digital signals the polarities of which are plus-minus reversed are input to the DACs and the amplifiers, respectively, output values from the DACs and the amplifiers have exactly opposite wave shapes ideally if the DACs and the amplifiers are the same DACs and the same amplifiers. Accordingly, the two output values are added to each other to ideally obtain an added sum of 0. On the other hand, when at least one of a combination of the DAC 520 and the amplifier 530 and a combination of the DAC 522 and the amplifier 532 is abnormal, the added sum is not 0. Therefore, the comparing circuit 576 compares the added sum with a predetermined threshold value (reference voltage). For example, when the added sum exceeds the predetermined threshold value as a result of comparison, an H-level signal is output to the judging circuit 586. When the added sum does not exceed the predetermined threshold value, an L-level signal is output to the judging circuit 586. The judging circuit 586 processes an output value from the comparing circuit 576 to judge normality/abnormality. A combination of the comparing circuit 576 and the judging circuit 586 serves as an example of a judging unit. More specifically, the judging circuit 586 processes the output value from the comparing circuit 576 to judge whether or not the added sum exceeds the predetermined threshold value. When the added sum exceeds the predetermined threshold value, it is judged that at least one of the combination of the DAC 520 and the amplifier 530 and the combination of the DAC 522 and the amplifier 532 is abnormal, and the result is output to the control computer 120. With this configuration, an abnormal sate, where at least one of the combination of the DAC 520 and the amplifier 530 and the combination of the DAC 522 and the amplifier 532 is abnormal, can be immediately detected. In this case, the combination of the DAC 520 and the amplifier 530 and the combination of the DAC 522 and the amplifier 532 are parts constituting the DAC amplifier unit 165. For this reason, when the added sum exceeds the predetermined threshold value, it can be detected that the DAC amplifier unit 165 is abnormal.

In FIG. 7, the abnormality detecting mechanism 596 is arranged in each of the DAC amplifier units. However, the abnormality detecting mechanism 596 may be arranged outside each of the DAC amplifier units and connected to the DAC amplifier unit by a wire such as a bus.

As described above, the abnormality detecting mechanism 596 is arranged in each of the DAC amplifier units to make it possible to independently detect abnormalities of the DAC amplifier units. In this manner, since abnormalities of the DAC amplifier units can be independently detected, abnormality of each DAC amplifier unit can be detected even though the polarities of voltages to be applied to a pair of electrodes of each deflector are not exactly opposite.

Fourth Embodiment

In the third embodiment, a (+) signal and a (−) signal are generated by the I/F circuit 510. However, a fourth embodiment describes a configuration in which the same (+) signal is branched by the I/F circuit 510.

Figure 8:
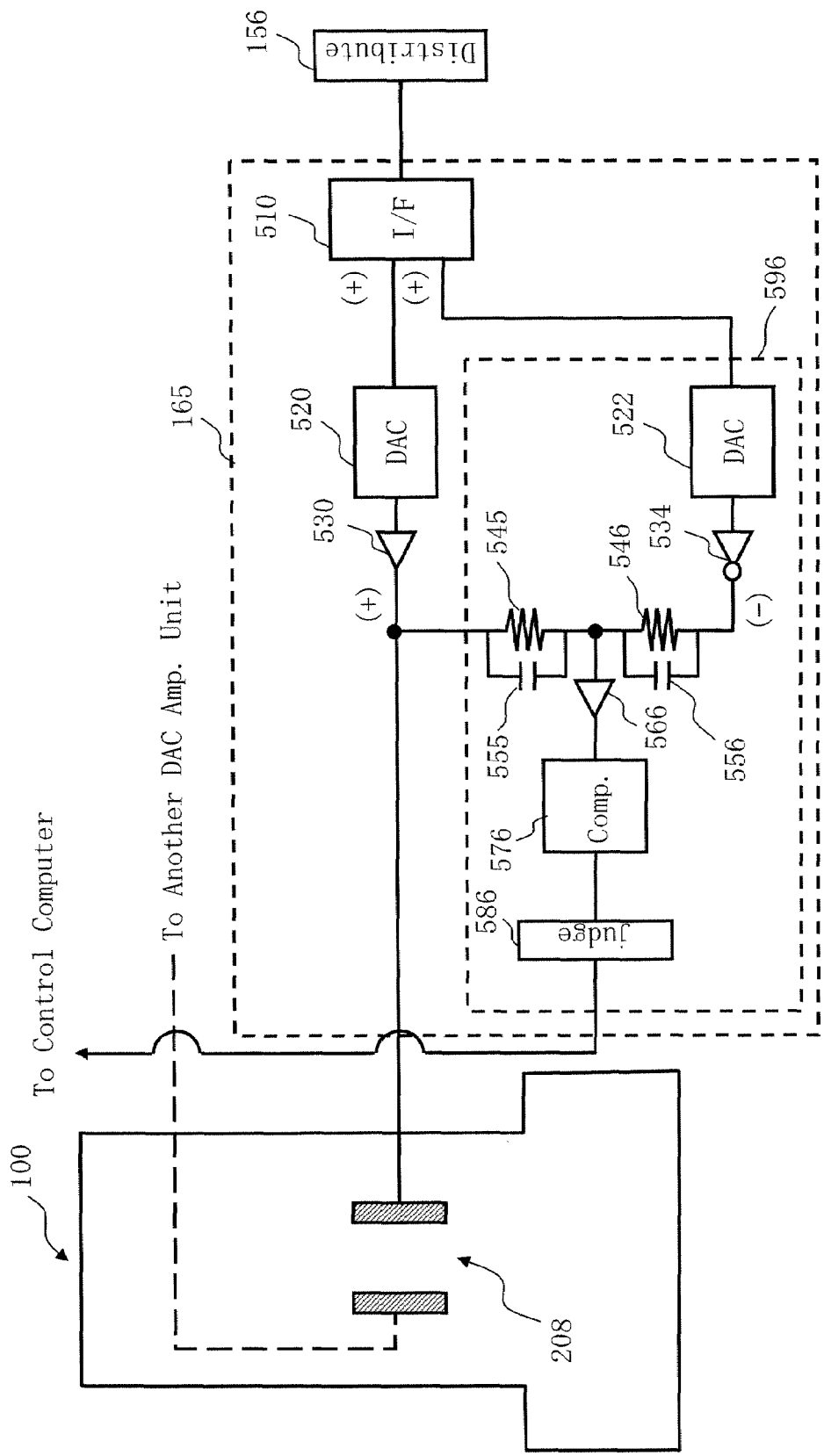
FIG. 8 is a conceptual diagram showing a configuration of a writing apparatus according to a fourth embodiment.

FIG. 8 is a conceptual diagram showing a configuration of a writing apparatus according to the fourth embodiment.

The configuration in FIG. 8 is the same as that in FIG. 7 except that a reverse amplifier 534 is arranged in place of the amplifier 532 in the abnormality detecting mechanism 596. The fourth embodiment also describes a case in which, of three deflectors including a BLK deflector 212, a shaping deflector 205 and an objective deflector 208 which perform beam deflection, an abnormal DAC amplifier for the objective deflector 208 as a representative is detected. The BLK deflector 212 and the shaping deflector 205 each have the same configuration as that of the objective deflector 208 can similarly identify an abnormal DAC amplifier. Furthermore, a case in which abnormality of the DAC amplifier for the objective deflector 208 is detected will be described with respect to the DAC amplifier unit 165 which applies a voltage to one electrode of the objective deflector 208. A DAC amplifier unit which applies a voltage to the other electrode has the same configuration as that of the DAC amplifier unit 165 to make it possible to identify an abnormal DAC amplifier unit.

Of the BLK deflector 212, the shaping deflector 205 and the objective deflector 208, the objective deflector 208 is representatively shown in FIG. 8. An abnormality detecting mechanism 596 is arranged in a DAC amplifier unit which applies a voltage to one electrode of the objective deflector 208. In this case, the DAC amplifier unit 165 will be described by way of example. The DAC amplifier unit 165 includes an I/F circuit 510 which processes a signal from the distributing circuit 156, a DAC 520, and an amplifier 530. Furthermore, the DAC amplifier unit 165 includes, as the abnormality detecting mechanism 596, a DAC 522, the reverse amplifier 534, a comparing circuit 576, a judging circuit 586, a resistor 545, a resistor 546, a capacitor 555, a capacitor 556, and an amplifier 566. The configuration in FIG. 8 is the same as that in FIG. 1 except that, in place of the abnormality detecting mechanism 192, the abnormality detecting mechanism 194 and the abnormality detecting unit 196 in FIG. 1, the abnormality detecting mechanism 596 is arranged in each of the DAC amplifier units. In FIG. 8, the DAC amplifier unit 165 which applies a voltage to one electrode for the objective deflector 208 is described as an example. However, other configurations will be omitted. Furthermore, in FIG. 8, constituent elements necessary to explain the fourth embodiment are described. The writing apparatus 100 may further include other configurations.

To the upstream side of the distributing circuit 156, a position deflection control circuit 146 for controlling a beam position in FIG. 1 is connected through a bus (not shown). The distributing circuit 156 converts control signals from the position deflection control circuit 146 into a (+) signal and a (−) signal, respectively. One of the signals and the other are distributed to the DAC amplifier unit 165 and the DAC amplifier unit 166, respectively. As in FIGS. 1 and 7, the (+) signal is distributed to the DAC amplifier unit 165 in FIG. 8. In the DAC amplifier unit 165, the I/F circuit 510 processes a digital (+) signal to perform timing generation, an insulating process, and the like. The (+) signal to be applied to a certain electrode of the objective deflector 208 is distributed to the DAC 520, and the same (+) signal is applied to the DAC 522 in synchronism with each other. One of the (+) signals is digital-analog converted (DA converted) by the DAC 520 and amplified by the amplifier 530 connected to the output of the DAC 520. A combination mechanism of the DAC 520 and the amplifier 530 serves as an example of a first DA converter unit. An output from the amplifier 530 is connected to one electrode of the objective deflector 208. An amplified analog value is applied to one electrode of the objective deflector 208 as a beam deflection voltage. On the other hand, the other DAC amplifier unit is connected to the other electrode of the pair of electrodes of the objective deflector 208. On this side, the input (+) signal is digital-analog converted (DA converted) by the DAC 522 and amplified by the reverse amplifier 534 connected to the output of the DAC 522 to reverse the polarity of the signal. A combination of the DAC 522 and the reverse amplifier 534 serves as one example of a second DAC converter unit.

In the DAC amplifier unit 165, an output value from the amplifier 530 is added, through the resistor 545 and the capacitor 555 which constitute a parallel circuit, to an output value obtained from the amplifier 532 through the resistor 546 and the capacitor 556 which similarly constitute a parallel circuit. The added analog value is amplified by the amplifier 566 and input to the comparing circuit 576 connected to the amplifier 566. The output side of the comparing circuit 576 is connected to the judging circuit 586.

Here, since the same (+) signals are output to the DAC 520 and the DAC 522, parity bits are preferably added to the (+) signals, respectively. The parity bits are added to the (+) signals to make it possible to assure the signals input to the DAC 520 and the DAC 522. A parity check mechanism is omitted in the diagram.

In this case, the DAC 520 receives, from the I/F circuit 510, a (+) digital signal for electro statically deflecting the electron beam 200. The DAC 520 converts the digital signal into an analog value. When the amplifier 530 amplifies the analog value and outputs the amplified analog value to the objective deflector 208 as a (+) voltage value, a signal having a (+) voltage value is branched to the comparing circuit 576. The (+) analog value serves as an example of a first analog value. A (+) voltage value obtained by amplifying the analog value serves as an example of a first voltage value.

Similarly, the DAC 522 receives the same (+) digital signals from the I/F circuit 510. The (−) digital signal is converted into an analog value. The analog value is reversely amplified by the reverse amplifier 534 to output a signal of a (−) voltage value to the comparing circuit 576 as a (−) voltage value. The voltages are added to each other to output an added sum to the comparing circuit 576. Each of the same (+) analog values serves as an example of a second analog value. A (−)

voltage value obtained by amplifying the analog value serves as an example of a second voltage value.

In this manner, the same digital signals are input to the DACs, respectively. One of the digital signal is directly amplified by an amplifier without being changed in sign, and the other is plus-minus reversed by the amplifier. As a consequence, output values from the DACs are analog values having exactly opposite wave shapes ideally if the DACs and the amplifiers are the same DACs and the amplifiers having the same capabilities except for the reversing capability. Accordingly, the two output values are added to each other to ideally obtain an added sum of 0. On the other hand, when at least one of a combination of the DAC 520 and the amplifier 530 and a combination of the DAC 522 and the amplifier 534 is abnormal, the added sum is not 0. Therefore, the comparing circuit 576 compares the added sum with a predetermined threshold value (reference voltage). For example, when the added sum exceeds the predetermined threshold value as a result of comparison, an H-level signal is output to the judging circuit 586. When the added sum does not exceed the predetermined threshold value, an L-level signal is output to the judging circuit 586. The judging circuit 586 processes an output value from the comparing circuit 576 to judge normality/abnormality. A combination of the comparing circuit 576 and the judging circuit 586 serves as an example of a judging unit. More specifically, the judging circuit 586 processes the output value from the comparing circuit 576 to judge whether or not the added sum exceeds the predetermined threshold value. When the added sum exceeds the predetermined threshold value, it is judged that at least one of the combination of the DAC 520 and the amplifier 530 and the combination of the DAC 522 and the amplifier 534 is abnormal, and the result is output to the control computer 120. With this configuration, an abnormal sate, where the case in which at least one of the combination of the DAC 520 and the amplifier 530 and the combination of the DAC 522 and the amplifier 534 is abnormal, can be immediately detected. In this case, the combination of the DAC 520 and the amplifier 530 and the combination of the DAC 522 and the amplifier 534 are parts constituting the DAC amplifier unit 165. For this reason, when the added sum exceeds the predetermined threshold value, it can be detected that the DAC amplifier unit 165 is abnormal.

As in FIG. 7, the abnormality detecting mechanism 596 is arranged in each of the DAC amplifier units in FIG. 8. However, the abnormality detecting mechanism 596 may be arranged outside each of the DAC amplifier units and connected to the DAC amplifier unit by a wire such as a bus.

As described above, the abnormality detecting mechanism 596 is arranged in each of the DAC amplifier units, and input digital signals to the DAC amplifier units are branched and caused to pass through the two DACs. Thereafter, one of the outputs is reversely added to make it possible to independently detect abnormalities of the DAC amplifier units. In this manner, since abnormalities of the DAC amplifier units can be independently detected, abnormalities of the DAC amplifier units can be independently detected even though the voltages to be applied to a pair of electrodes of each deflector are plus-minus reversed.

Fifth Embodiment

The third and fourth embodiments cope with the case in which the voltages to be applied to a pair of electrodes of each deflector are not exactly opposite by using the configuration which independently detects abnormalities of the DAC amplifier units. However, a fifth embodiment will describe a case in which abnormality is detected by using the two DAC amplifiers for a pair of electrodes as in the first embodiment.

Figure 9:
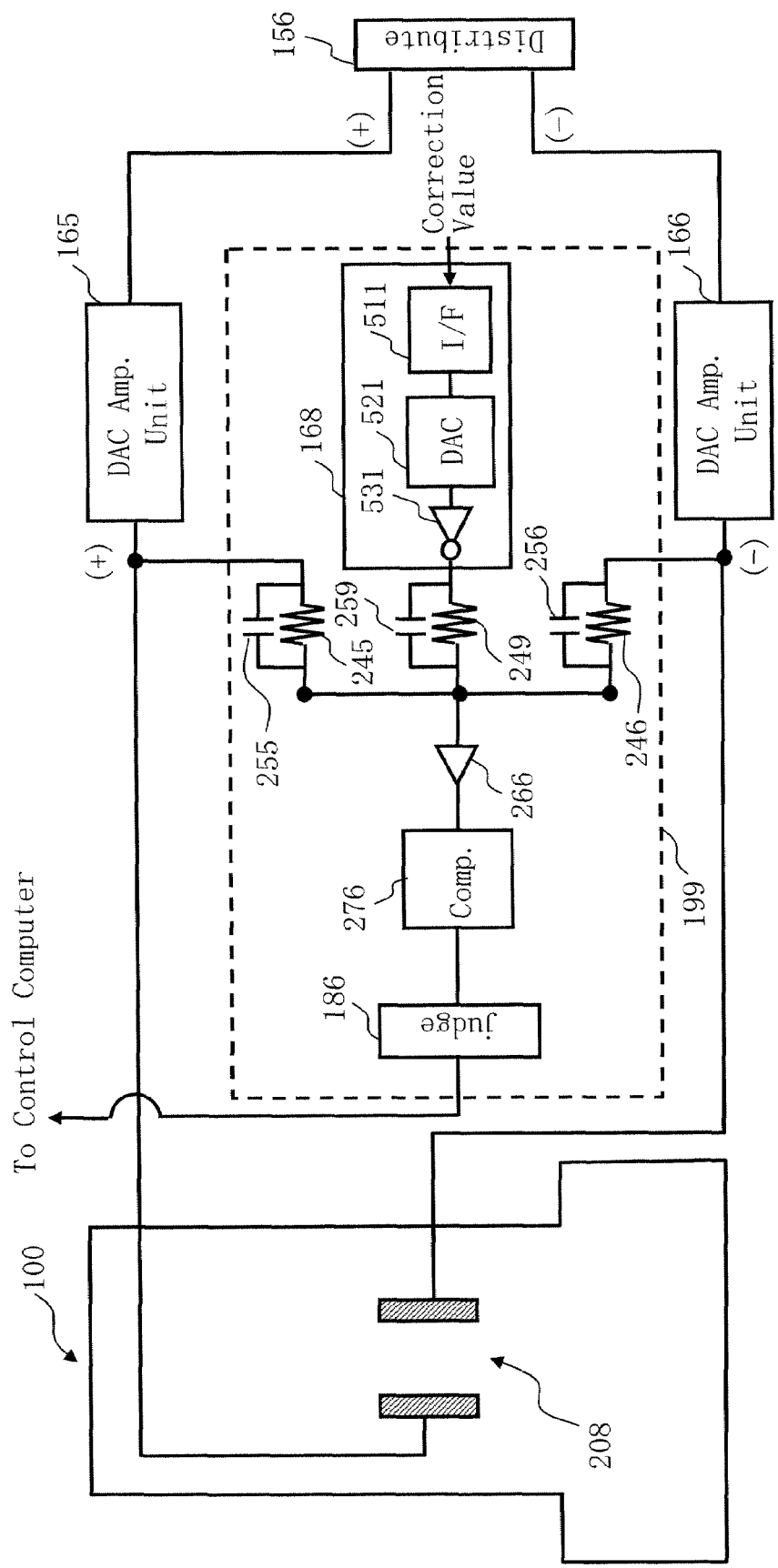
FIG. 9 is a conceptual diagram showing a configuration of a writing apparatus according to a fifth embodiment.

FIG. 9 is a conceptual diagram showing a configuration of a writing apparatus according to the fifth embodiment.

FIG. 9 has the same configuration as that in FIG. 1 except that an abnormality detecting mechanism 199 is arranged in place of the abnormality detecting unit 196. The fifth embodiment also describes a case in which, of three deflectors including a BLK deflector 212, a shaping deflector 205, and an objective deflector 208 which perform beam deflection, an abnormal DAC amplifier for the objective deflector 208 as a representative is detected. The BLK deflector 212 and the shaping deflector 205 each have the same configuration as that of the objective deflector 208 can similarly identify an abnormal DAC amplifier.

Of the BLK deflector 212, the shaping deflector 205 and the objective deflector 208, the objective deflector 208 is representatively shown in FIG. 9. As the abnormality detecting mechanism 199, the abnormality detecting unit 196 further includes a DAC amplifier unit 168, a resistor 249, and a capacitor 259. The DAC amplifier unit 168 further includes an I/F circuit 511, a DAC 521, and a reverse amplifier 531. FIG. 9 has the same configuration as that in FIG. 1 except that, in addition to the abnormality detecting mechanism 192, the abnormality detecting mechanism 194 and the abnormality detecting unit 196 in FIG. 1, the DAC amplifier unit 168 including the I/F circuit 511, the DAC 521 and the reverse amplifier 531, the resistor 249, and the capacitor 259 are additionally arranged. FIG. 9 describes, as an example, the DAC amplifier unit 165 which applies a voltage to one electrode of the pair of electrodes of the objective deflector 208 and the DAC amplifier unit 166 which applies a voltage to the other electrode. However, other configurations will be omitted. Furthermore, constituent elements necessary to explain the fifth embodiment are described in FIG. 9. The writing apparatus 100 may further include other configurations.

When a correction voltage is applied in FIG. 6 described above, a digital signal indicating a sum of correction values input to DAC amplifier units for a pair of electrodes is input to the DAC amplifier unit 168 in FIG. 9 in synchronism with inputs to the DAC amplifier unit 165 and the DAC amplifier unit 166. In the DAC amplifier unit 168, the I/F circuit 511 processes a digital signal to perform timing generation, an insulating process, and the like. The signal is digital-analog converted (DA converted) by the DAC 521. The resultant analog signal is amplified by the reverse amplifier 531 connected to the output of the DAC 521 such that the analog signal is reversed in sign. Through the resistor 249 and the capacitor 259 which constitute a parallel circuit, an output value from the amplifier 168 is added to an output value obtained from the amplifier DAC amplifier unit 165 through the resistor 245 and the capacitor 255 which similarly constitute a parallel circuit and an output value obtained from the DAC amplifier unit 166 through the resistor 246 and the capacitor 256 which similarly constitute a parallel circuit. The added analog value is amplified by the amplifier 266 and input to the comparing circuit 276 connected to the amplifier 266. The output side of the comparing circuit 276 is connected to the judging circuit 186.

Also in the fifth embodiment, the DAC amplifier unit 165 receives, from the distributing circuit 156, a (+) digital signal added with a correction voltage for statistically deflecting the electron beam 200. The DAC amplifier unit 165 converts the digital signal into an analog signal. When the analog value is amplified and output to the objective deflector 208 as a (+) voltage value, a signal having a (+) voltage value is branched to the comparing circuit 276. The DAC amplifier unit 165 serves as an example of a first DA converter unit. The (+) analog value serves as an example of a first analog value. A (+) voltage value obtained by amplifying the analog value serves as an example of a first voltage value.

Similarly, the DAC amplifier unit 166 receives, from the distributing circuit 156, a (−) digital signal added with a correction voltage for statistically deflecting the electron beam 200. The DAC amplifier unit 166 converts the digital signal into an analog signal. When the analog value is amplified and output to the objective deflector 208 as a (−) voltage value, a signal having a (−) voltage value is branched to the comparing circuit 276. The DAC amplifier unit 166 serves as an example of a second DA converter unit. The (−) analog value serves as an example of a second analog value. A (−) voltage value obtained by amplifying the analog value serves as an example of a second voltage value.

As described above, if correction voltage is 0, the two digital signals, the polarities of which are opposite, are input to the DAC amplifier units, respectively, so that output values from the DAC amplifier units have exactly opposite wave shapes ideally if the DAC amplifier units are same in design. Accordingly, when the two output values are added an added sum is 0. However, since the correction voltage is added, the analog values having the exactly opposite wave shapes cannot be obtained. Therefore, a sum of the correction values added to the DAC amplifier unit 165 and the DAC amplifier unit 166 is input to the DAC amplifier unit 168. The DAC amplifier unit 168 serves as an example of a third DA converter unit. The output value from the DAC amplifier unit 168 is ideally an analog value having an opposite wave shape of the wave shape of the sum of the correction values added to the DAC amplifier unit 165 and the DAC amplifier unit 166 if DAC amplifies are. Therefore, when the three output values are added to each other an added sum is 0 ideally.

On the other hand, when at least one of the DAC amplifier unit 165 and the DAC amplifier unit 166 is abnormal, the added sum is not 0. Therefore, the comparing circuit 276 compares the added sum with a predetermined threshold value (reference voltage). For example, when the added sum exceeds the predetermined threshold value as a result of comparison, an H-level signal is output to the judging circuit 186. When the added sum does not exceed the predetermined threshold value, an L-level signal is output to the judging circuit 186. The judging circuit 186 processes an output value from the comparing circuit 276 to judge normality/abnormality. A combination of the comparing circuit 276 and the judging circuit 186 serves as an example of a judging unit. More specifically, the judging circuit 186 processes the output value from the comparing circuit 276 to judge whether the added sum exceeds the predetermined threshold value. When the added sum exceeds the predetermined threshold value, it is judged that at least one of the DAC amplifier unit 165, the DAC amplifier unit 166 and the DAC amplifier unit 168 is abnormal, and the result is output to the control computer 120. With this configuration, an abnormal sate, where the case in which at least one of the DAC amplifier unit 165, the DAC amplifier unit 166 and the DAC amplifier unit 168 is abnormal, can be immediately detected. Since an analog value generally includes noise as shown in FIG. 4, the predetermined threshold value is used in decision to make it possible to reduce erroneous determinations. When the noise is small or negligible, the threshold value may be set at 0 or approximately 0. Furthermore, as described above, the added sum is processed by the comparing circuit 276 and the judging circuit 186, which serve as the judging unit, to make it possible to judge that at least one of the DAC amplifier unit 165, the DAC amplifier unit 166 and the DAC amplifier unit 168 is abnormal.

As described above, when the electron beam 200 is controlled in deflection by plus-minus reversed voltages of a pair of electrodes and correction voltages, abnormality of at least one of the DAC amplifier units can be detected in such a manner that output values from the DAC amplifiers which output plus-minus reversed voltages added with correction voltages are added to an output value from the DAC amplifier which outputs a voltage obtained by reversing a sum of the correction values. If it is known that at least one of the DAC amplifier units is abnormal, it can be judged whether specific one of the DAC amplifiers is abnormal, whether two DAC amplifiers are abnormal, or whether tree DAC amplifiers are abnormal when a test is performed again while sequentially replacing DAC amplifiers.

As described above, even when a correction value is added to the beam deflection voltage, it possible to detect abnormality the DA amplifiers by adding another DAC amplifier whose output is an analog value obtained by reversing a sum of corrected value.

Sixth Embodiment

In each of the embodiments described above, a comparing circuit compares an added sum of outputs from DAC amplifier units (or DACs) with a predetermined threshold value (reference value). However, the invention is not limited to this configuration.

Figure 10:
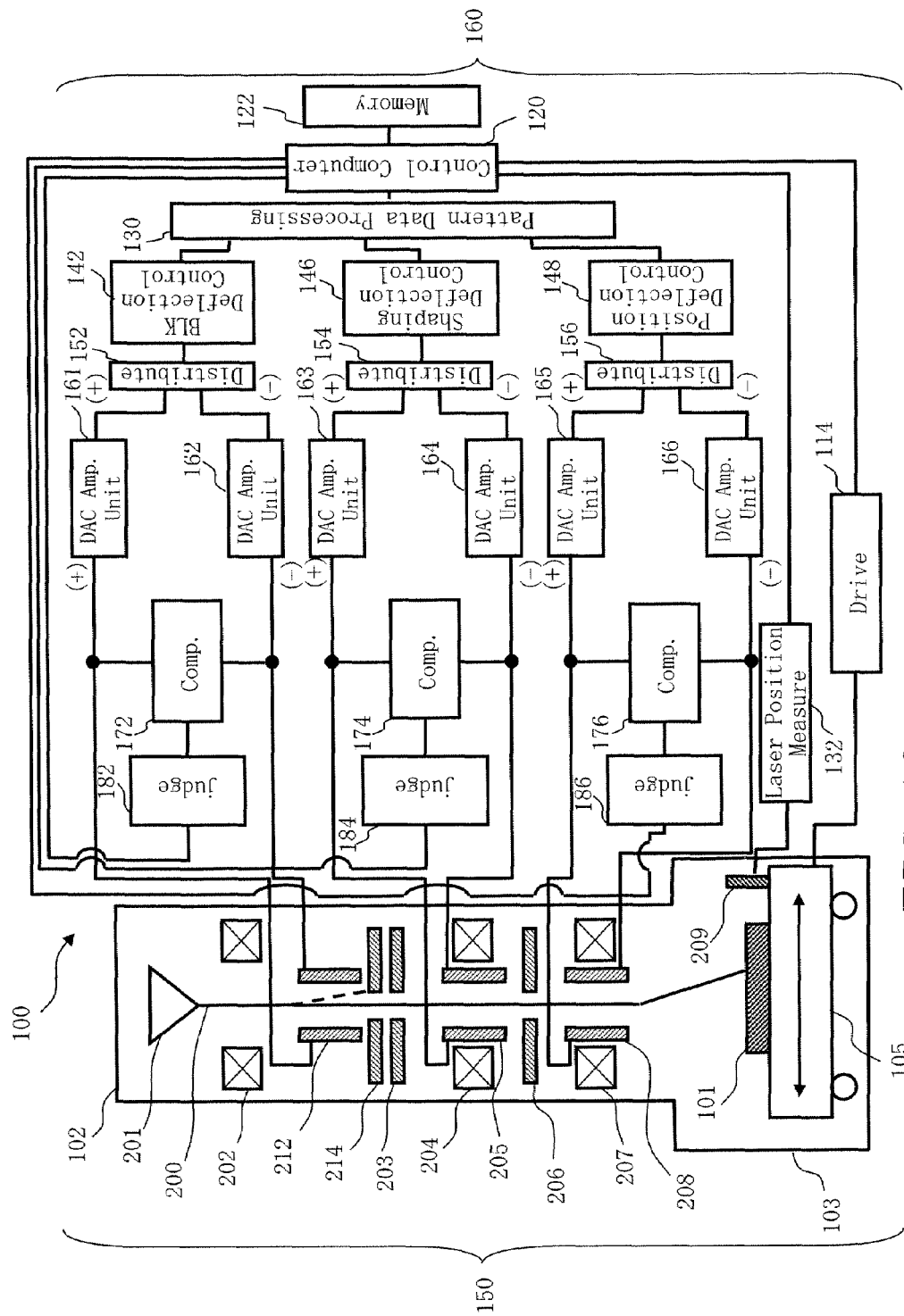
FIG. 10 is a conceptual diagram showing a configuration of a writing apparatus according to a fifth embodiment.
Figure 11:
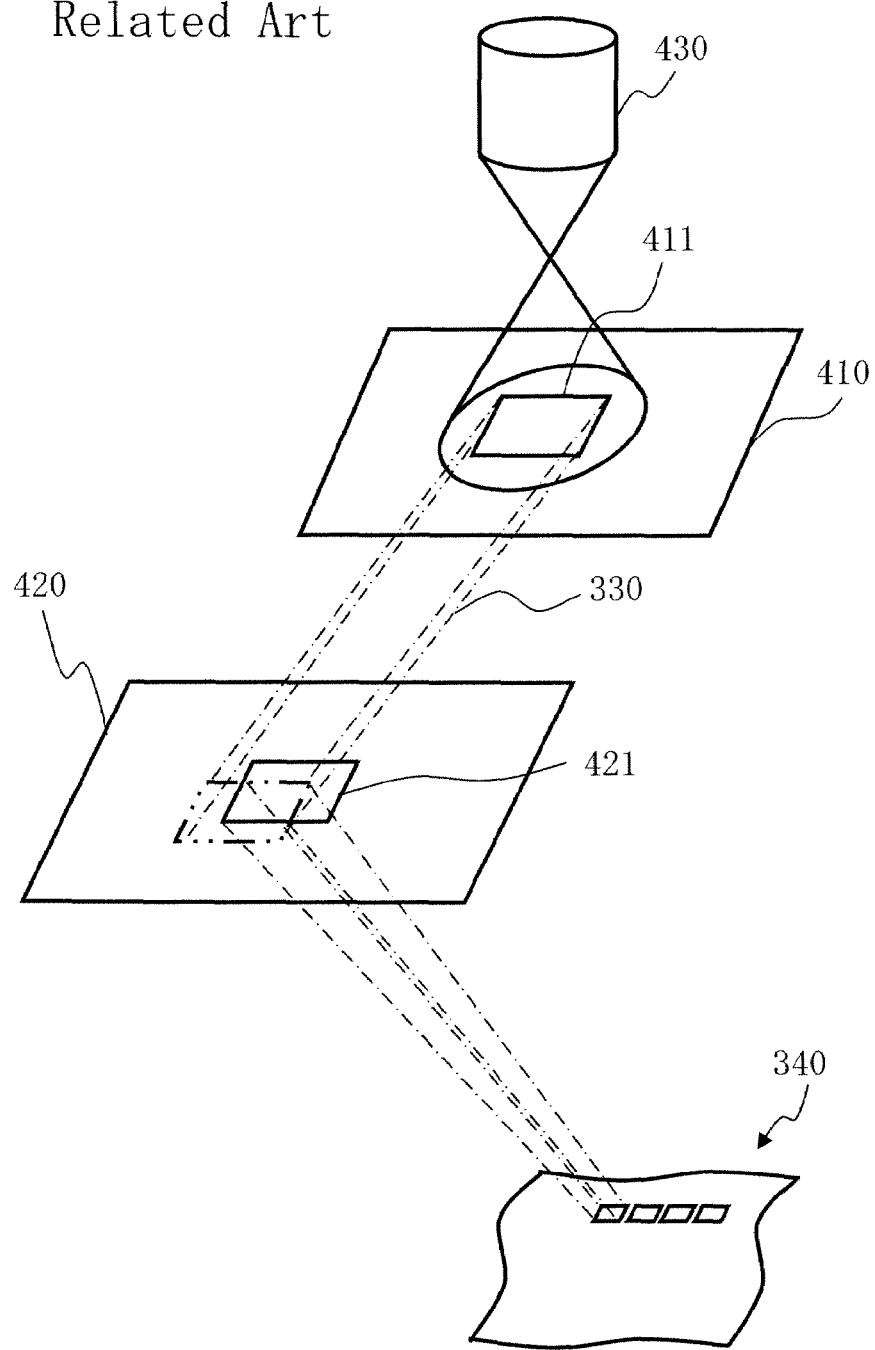
FIG. 11 is a conceptual diagram showing an operation of a variable-shaped electron beam writing apparatus.

FIG. 10 is a conceptual diagram showing a configuration of a writing apparatus according to a sixth embodiment.

A writing apparatus 100 in FIG. 10 has the same configuration as that in FIG. 1 except that a comparing circuit 172 is arranged in place of the comparing circuit 272, the resistor 241, the resistor 242, the capacitor 251, the capacitor 252 and the amplifier 262 in FIG. 1, that a comparing circuit 174 is arranged in place of the comparing circuit 274, the resistor 243, the resistor 244, the capacitor 253, the capacitor 254 and the amplifier 264, and that a comparing circuit 176 is arranged in place of the comparing circuit 276, the resistor 245, the resistor 246, the capacitor 255, the capacitor 256 and the amplifier 266. Operations performed until outputs from the DAC amplifier units are branched to the comparing circuits are the same as those in the first embodiment.

As described above, when the two digital signals, the polarities of which are exactly opposite, are input to the DAC amplifier units, respectively, output values from the DAC amplifier unit 161 and the DAC amplifier unit 162 have exactly opposite wave shapes ideally if the DAC amplifier units are same. Therefore, the comparing circuit 172 receives the outputs from the DAC amplifier units to compare the wave shapes to check whether or not the wave shapes are exactly opposite to each other. For example, when the wave shapes are exactly opposite to each other as a result of the comparison, an H-level signal is output to the judging circuit 182. When the wave shapes are not exactly opposite to each other, an L-level signal is output to the judging circuit 182. The judging circuit 182 processes an output value from the comparing circuit 172 to judge normality/abnormality. A combination of the comparing circuit 172 and the judging circuit 182 serves as an example of a judging unit. When abnormality is judged by the judging circuit 182, the judged result is output to the control computer 120. When abnormality is judged by the judging circuit 182, an abnormal sate, where at least one of the DAC amplifier unit 161 and the DAC amplifier unit 162 is abnormal, can be immediately detected. A method of checking whether the outputs from the DAC amplifier units have exactly opposite wave shapes is not limited to the method of comparing the wave shapes by using an added sum, and another method may be used. For example, the decision may be made by comparison performed by checking whether a difference between absolute values of outputs from the DAC amplifier units exceeds a predetermined threshold.

Similarly, with respect to shaping deflection, when the two digital signals, the polarities of which are opposite, are input to the DAC amplifier units, respectively, output values from the DAC amplifier unit 163 and the DAC amplifier unit 164 have exactly opposite wave shapes ideally if the DAC amplifier units are same in design. Therefore, the comparing circuit 174 receives the outputs from the DAC amplifier units to compare the wave shapes to check whether or not the wave shapes are exactly opposite to each other. For example, when the wave shapes are exactly opposite to each other as a result of the comparison, an H-level signal is output to the judging circuit 182. When the wave shapes are not exactly opposite to each other, an L-level signal is output to the judging circuit 182. The judging circuit 184 processes an output value from the comparing circuit 174 to judge normality/abnormality. A combination of the comparing circuit 174 and the judging circuit 184 serves as an example of a judging unit. When abnormality is judged by the judging circuit 184, the judged result is output to the control computer 120. When abnormality is judged by the judging circuit 184, an abnormal sate, where at least one of the DAC amplifier unit 163 and the DAC amplifier unit 164 is abnormal, can be immediately detected. A method of checking whether or not the outputs from the DAC amplifier units have exactly opposite wave shapes is not limited to the method of comparing the wave shapes by using an added sum, and another method may be used. For example, the decision may be made by comparison performed by checking whether a difference between absolute values of outputs from the DAC amplifier units exceeds a predetermined threshold.

Similarly, with respect to position deflection, when the two digital signals, the polarities of which are reversed, are input to the DAC amplifier units, respectively, output values from the DAC amplifier unit 165 and the DAC amplifier unit 166 have exactly opposite wave shapes ideally if the DAC amplifier units are same in design. Therefore, the comparing circuit 176 receives the outputs from the DAC amplifier units to compare the wave shapes to check whether or not the wave shapes are exactly opposite to each other. For example, when the wave shapes are exactly opposite to each other as a result of the comparison, an H-level signal is output to the judging circuit 182. When the wave shapes are not exactly opposite to each other, an L-level signal is output to the judging circuit 182. The judging circuit 184 processes an output value from the comparing circuit 176 to judge normality/abnormality. A combination of the comparing circuit 176 and the judging circuit 186 serves as an example of a judging unit. When abnormality is judged by the judging circuit 186, the judged result is output to the control computer 120. When abnormality is judged by the judging circuit 186, an abnormal sate, where which at least one of the DAC amplifier unit 165 and the DAC amplifier unit 166 is abnormal, can be immediately detected. A method of checking whether or not the outputs from the DAC amplifier units have exactly opposite wave shapes is not limited to the method of comparing the wave shapes by using an added sum, and another method may be used. For example, the decision may be made by comparison performed by checking whether or not a difference between absolute values of outputs from the DAC amplifier units exceeds a predetermined threshold.

As described above, another method can detect abnormalities of the DAC amplifier units if it can judge whether the outputs from the DAC amplifier units have exactly opposite wave shapes, besides a method using an added sum of outputs from the DAC amplifier units.

The embodiments have been described with reference to the concrete examples. However, the present invention is not limited to these concrete examples. For example, in the sixth embodiment, a judging circuit judges whether or not outputs from DAC amplifier units have exactly opposite wave shapes. However, as in the third or fourth embodiment, when outputs from amplifiers after passing through DACs are compared with each other, an added sum of the outputs from the amplifiers is not compared with a threshold value, but a judging circuit may also preferably judge whether or not the outputs from the amplifiers have exactly opposite wave shapes. Furthermore, the judging unit is preferably designed to judge abnormalities of the DAC amplifier units at any time during writing. In this manner, abnormality can be always detected during writing.

In each of the embodiments, a parallel cable is preferably used as a bus to transmit a digital signal before DA conversion. The use of the parallel table makes it possible to obtain a high-speed operation.

In each of the embodiments, a scheme which applies a voltage to an electrostatic deflector is used in deflection of an electron beam. However, a current may be caused to flow in a coil or the like to deflect the electron beam. In this case, an analog value of a DAC output may be used as not a voltage value but a current value.

As described in each of the embodiments, a method of adding plus and minus outputs to set an added output level at "0" is very effective as a feasible method. By adding the outputs to make the added sum nearly 0, it is possible to improve accuracy of abnormality detection.

For example, when a shaped electron beam is deflected by using two-step main and sub-deflection to perform positioning, for example, an output level of a sub-deflector is 0 to 50 μm in terms of beam deflection amount. An abnormal level to be detected is 10 nm or less. In general, it is difficult to make a detector capable of directly detecting a variation in voltage corresponding to 10 nm in a change in voltage corresponding to 0 to 50 μm. However, as in the embodiments described above, a normal signal level is always "0" in ideal case where the plus and minus voltages are canceled out. With reference to this signal level, a variation in voltage or the like corresponding to 10 nm or less is detected, and highly accurate detection can be realized.

In a general, writing apparatus frequently employs a deflector of an antithetical structure for another purpose. A method of detecting abnormality by just adding outputs from antithetical amplifiers makes it possible to construct a compact system to check and monitor all DAC amplifiers of the writing apparatus.

Causes of a writing error includes, abnormality of an upstream circuit, causes by other factors, and the like, in addition to an abnormal amplifier. These causes can not be easily discriminated from each other by pattern abnormality detected by a defect inspection apparatus or the like in many cases. A long time is required to investigate the cause. Therefore, when it can be confirmed that at least a DAC amplifier unit is normal in writing, a DAC amplifier unit factor can be removed from the causes of the abnormality in writing. For this reason, the invention can also considerably contribute to save time for resolving the writing error.

The embodiments described above have a remarkable advantage of capability of always detecting abnormality during actual writing. First, the fact that a mask written and manufactured is assured to be written without abnormality of DAC amplifier units makes mask assurance more reliable from the conventional mask assurance by inspection performed by an inspection apparatus. This is a very important element of a high-precision mask.

Second, information useful for identifying a cause, improving a DAC amplifier unit, and the like can be obtained by collecting and analyzing data of abnormal statuses detected during writing. With respect to abnormality of the DAC amplifier unit, for example, influence of noise and influence of a operation environment/status which may cause the abnormality cannot be reproduced, and the abnormality does not reappear in many cases as described above. For this reason, it is difficult to identify abnormality. In contrast to this, according to the embodiments described above, data of abnormal statuses detected during writing can be collected. Therefore, when the obtained data is analyzed, information useful for identifying a cause, improving a DAC amplifier, and the like can also be obtained. The writing apparatus is preferably designed to have a function that reports relative information or the like including a abnormally written pattern, shape, and the like obtained from an abnormality status of a DAC amplifier unit when abnormality occurs.

When abnormality is detected, a DAC amplifier unit may be completely broken to always exhibit abnormality, and the apparatus must be stopped. On the other hand, detected abnormality may be an erroneous detection or sporadic, in that case the position may be carefully checked in mask inspection to judge the abnormality according to a report of information of abnormality detect including information of a position or the like. Therefore, in any case, the following configuration is more preferable. The report is transmitted to a system which controls the whole apparatus to communicate with a user for proper decision.

In the embodiments described above, an analog value is compared by a comparing circuit, but the invention is not limited to this configuration. In order to follow a high-speed deflecting process, an analog value is preferably used without being converted into a digital value because conversion time can be saved. However, comparison may be performed after an analog value is converted into a digital value. In particular, an added sum is input to a comparing circuit, comparison may be performed after the analog value is converted into a digital value. In this case, after the added sum is amplified by an amplifier, an AD converter is arranged on the input side of the comparing circuit.

Although parts and the like such as an apparatus configuration and a control method which are not directly unnecessary for explanation of the present invention are omitted, a necessary apparatus configuration and a necessary control method can be appropriately selected and used. For example, although a control unit configuration for controlling the writing apparatus 100 is omitted, a necessary control unit configuration can be appropriately selected and used, as a matter of course.

Furthermore, all astigmatism correcting methods, charged particle beam writing methods, and charged particle beam writing apparatuses which include the elements of the present invention and which can be appropriately changed in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam apparatus comprising:
    a plurality of digital-analog (DA) converter units configured to input digital signals, convert the digital signals into analog values, and amplify the analog values to output the analog values;
    a deflector configured to input at least one analog value of the plurality of analog values output from the plurality of DA converter units to deflect a charged particle beam; and
    a judging unit configured to judge that at least one of the plurality of DA converter units is abnormal by using the plurality of analog values output from the plurality of DA converter units, wherein
    the charged particle beam apparatus comprises: as the plurality of DA converter units,
    a first digital-analog (DA) converter unit configured to input a digital signal for deflecting the charged particle beam, converts the digital signal into a first analog value, and amplifies the first analog value to output the first analog value to the deflector;
    a second DA converter unit configured to input a plus-minus reversed signal obtained by reversing a polarity of the digital signal in synchronism with the digital signal, converts the plus-minus reversed signal into a second analog value, and amplifies the second analog value to output the second analog value, and
    the judging unit judges that at least one of the first and second DA converter units is abnormal by using the output first analog value and the output second analog value.

2. The charged particle beam apparatus according to claim 1, wherein
    the judging unit judges that at lest one of the plurality of DA converter units when a sum of the plurality of output analog values exceeds a predetermined threshold value.

3. A charged particle beam apparatus comprising:
    a plurality of digital-analog (DA) converter units configured to input digital signals, convert the digital signals into analog values, and amplify the analog values to output the analog values;
    a deflector configured to input at least one analog value of the plurality of analog values output from the plurality of DA converter units to deflect a charged particle beam;
    a judging unit configured to judge that at least one of the plurality of DA converter units is abnormal by using the plurality of analog values output from the plurality of DA converter units; and
    a writing unit configured to write a predetermined pattern on a target object by using a charged particle beam, wherein
    the judging unit always performs judgment of abnormality of the plurality of DA converter units during writing.

4. A charged particle beam apparatus comprising:
    a plurality of digital-analog (DA) converter units configured to input digital signals, convert the digital signals into analog values, and amplify the analog values to output the analog values;
    a deflector configured to input at least one analog value of the plurality of analog values output from the plurality of DA converter units to deflect a charged particle beam; and
    a judging unit configured to judge that at least one of the plurality of DA converter units is abnormal by using the plurality of analog values output from the plurality of DA converter units, wherein the charged particle beam apparatus comprises: as the plurality of DA converter units, a first digital-analog (DA) converter unit configured to input a first digital signal and a correction digital signal for deflecting the charged particle beam, converts the first digital signal and the correction signal into a first analog value, and amplifies the first analog value to output the first analog value to the deflector as a first voltage value;

a second DA converter unit configured to input a plus-minus reversed signal obtained by reversing a polarity of the first digital signal in synchronism with the first digital signal, converts the plus-minus reversed signal into a second analog value, and amplifies the second analog value to output the second analog value as a second voltage value;

a third DA converter unit configured to input a third digital signal which is same as the correction signal, converts the third digital signal into a third analog value, and plus-minus reversely amplifies the third analog value to output the third analog value as a third voltage value, and the judging unit judges that at least one of the first and second DA converter units is abnormal when a sum of the first voltage, the second voltage, and the third voltage exceeds a predetermined threshold value.

5. An abnormality detecting method of detecting abnormality of a digital-analog (DA) converter units which outputs an analog value to a deflector which deflects a charged particle beam, comprising:

by using first and second DA converter units, causing the second DA converter unit to synchronously output a plus-minus reversed output value which is opposite to an output value from the first DA converter unit; and detecting abnormality of at least one of the first and second DA converter units when an sum value between the output value from the first DA converter unit and the plus-minus reversed output value from the second DA converter unit exceeds a threshold value to output a result of the detecting.

6. A charged particle beam writing method of writing a pattern on a target object by using a charged particle beam, comprising:

during writing, causing a second DA converter unit to synchronously output a plus-minus reversed output value which is opposite to an output value from a first digital-analog (DA) converter unit for use in beam deflection; and judging that at least one of the first and second DA converter units is abnormal when a sum of the output value from the first DA converter unit and the plus-minus reversed output value from the second DA converter unit exceeds a predetermined threshold value to output a result of the detecting.

7. A mask comprising:

a glass substrate; and a predetermined film which is formed on the glass substrate and has a pattern written by using a writing apparatus in which, when, during writing, a sum of an output value from a first digital-analog (DA) converter unit for use in beam deflection and a plus-minus reversed output value from a second DA converter unit which is output in synchronism with the output value from the first DA converter unit exceeds a predetermined threshold value, it is judged that at least one of the first and second DA converter units is abnormal.

* * * * *